(12) United States Patent
Fujii et al.

(10) Patent No.: US 8,366,259 B2
(45) Date of Patent: Feb. 5, 2013

(54) FILM FORMATION METHOD, FILM FORMATION DEVICE, PIEZOELECTRIC FILM, PIEZOELECTRIC DEVICE, LIQUID DISCHARGE DEVICE AND PIEZOELECTRIC ULTRASONIC TRANSDUCER

(75) Inventors: Takamichi Fujii, Kanagawa-ken (JP); Takayuki Naono, Kanagawa-ken (JP); Takami Arakawa, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/443,042

(22) Filed: Apr. 10, 2012

(65) Prior Publication Data

US 2012/0193225 A1 Aug. 2, 2012

Related U.S. Application Data

(62) Division of application No. 12/618,324, filed on Nov. 13, 2009, now Pat. No. 8,172,372.

(30) Foreign Application Priority Data

Nov. 17, 2008 (JP) .................. 2008-293267
Aug. 10, 2009 (JP) .................. 2009-185799

(51) Int. Cl.
*B41J 2/17* (2006.01)
(52) U.S. Cl. ...................................... 347/97

(58) Field of Classification Search ............ 347/68, 347/70–72, 20, 95, 97; 310/334; 204/298.11; 427/569
See application file for complete search history.

(56) References Cited

U.S. PATENT DOCUMENTS

| 5,376,857 A | 12/1994 | Takeuchi et al. |
| 5,510,011 A | 4/1996 | Okamura et al. |
| 6,287,986 B1 | 9/2001 | Mihara |
| 7,768,178 B2 | 8/2010 | Fujii et al. |
| 2008/0081128 A1 | 4/2008 | Fujii |

FOREIGN PATENT DOCUMENTS

JP 2002-129320 A 5/2002

OTHER PUBLICATIONS

Table 8.1.7 shown in "Shinku Handobukku (Handbook of Vacuum Technology)" Ed. Ulvack, Inc.; Pub. Ohmsha Ltd. (1982).

*Primary Examiner* — An Do
(74) *Attorney, Agent, or Firm* — Birch, Stewart, Kolasch & Birch, LLP

(57) ABSTRACT

When a film containing constituent elements of a target is formed on a substrate through a vapor deposition process using plasma with placing the substrate and the target to face each other, a potential in a spatial range of at least 10 mm extending laterally from the outer circumference of the substrate is controlled to be equal to a potential on the substrate, and/or the substrate is surrounded with a wall surface having a potential controlled to be equal to the potential on the substrate.

10 Claims, 12 Drawing Sheets

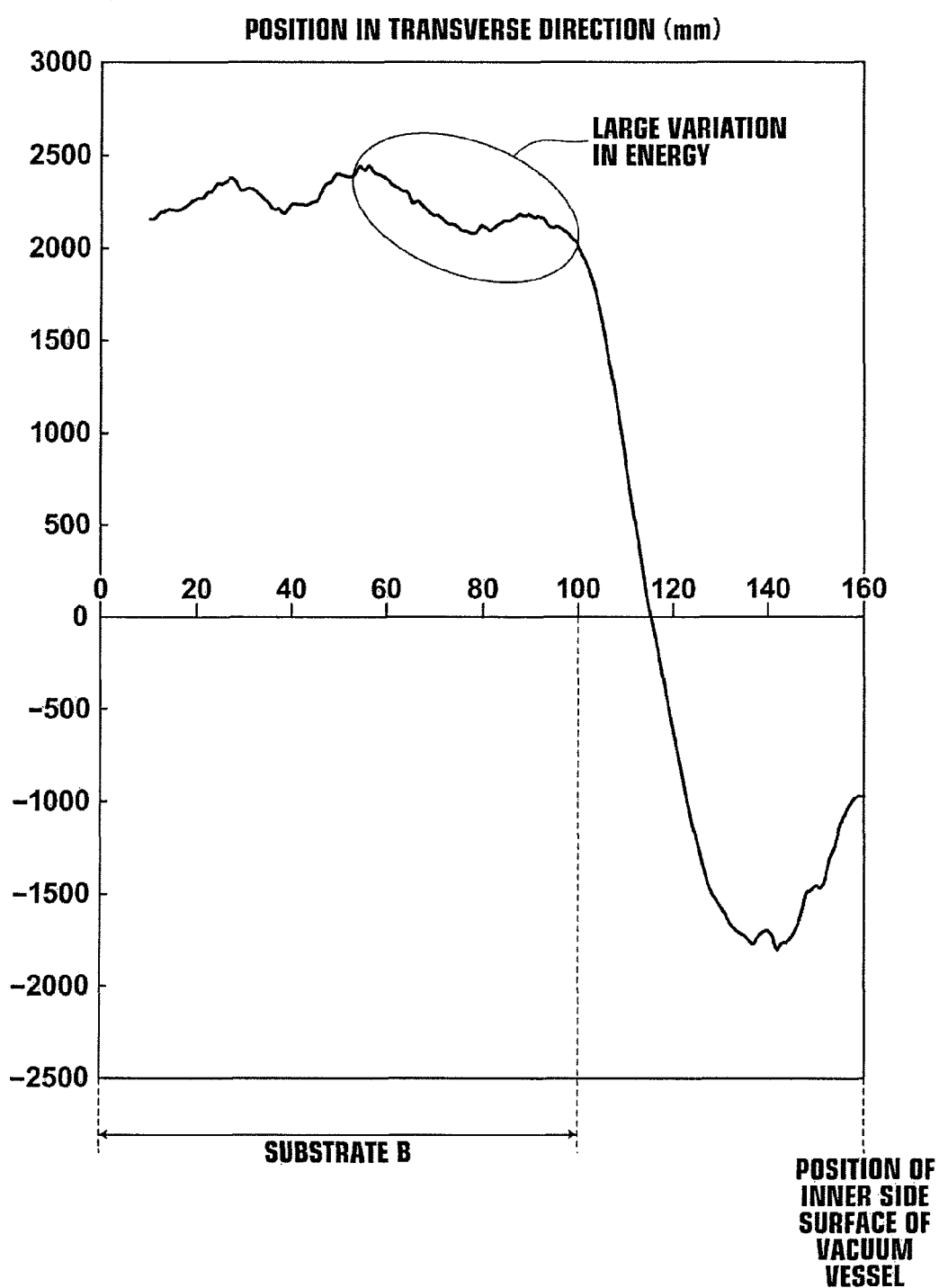

FILM FORMATION METHOD, FILM FORMATION DEVICE, PIEZOELECTRIC FILM, PIEZOELECTRIC DEVICE, LIQUID DISCHARGE DEVICE AND PIEZOELECTRIC ULTRASONIC TRANSDUCER

This application is a Divisional of application Ser. No. 12/618,324, Now U.S. Pat. No. 8,172,372 filed on Nov. 13, 2009, which claims priority to Application Nos. 2008-293267 and 2009-185799 filed in Japan on Nov. 17, 2008 and Aug. 10, 2009, respectively. The entire contents of all of the above applications are hereby incorporated by reference.

FIELD OF THE INVENTION

The present invention relates to a film formation method and a film formation device for forming, on a substrate, a film containing constituent elements of a target through vapor deposition using plasma. The present invention also relates to a piezoelectric film formed with the film formation method, as well as a piezoelectric device, a liquid discharge device and a piezoelectric ultrasonic transducer including the piezoelectric film.

DESCRIPTION OF THE RELATED ART

Sputtering is a film formation method, in which a substrate and a target are placed to face each other, and a gas which is plasmized under reduced pressure is made to collide against the target, so that the energy of the collision makes molecules or atoms be ejected from the target and deposited on the substrate. In vapor phase film formation, the substrate is usually an insulator, and is electrically insulated from the ground, i.e., is floated.

U.S. Pat. No. 5,510,011 (hereinafter referred to as patent document 1) has proposed to carry out sputtering with applying a predetermined bias potential to the substrate to increase incident energy of positive ions hitting the substrate.

Patent document 1 has also proposed to provide a third electrode that surrounds a plasma discharge space formed between a sputter electrode, which is connected to a radio frequency power supply for generating plasma, and a substrate electrode, which is connected to a DC power supply or a radio frequency power supply for applying a positive bias, and to place a target material on the target electrode and apply a negative DC voltage to the third electrode (claim 1).

Patent document 1 has further proposed: to connect to a substrate electrode a DC power supply for applying a biasing DC voltage; to connect to a sputter electrode a radio frequency power supply and a DC power supply; to alternately apply, with an alternate applying means, a DC voltage which is lower than a threshold value for effecting sputtering of a target material and a DC voltage which is higher than the threshold value; and to vary, with a matching circuit control means, a circuit constant at a matching circuit (matching box) of the radio frequency power supply synchronously with the changes of the DC voltage (claim 4).

Patent document 1 has further proposed: to connect to a sputter electrode a radio frequency power supply; to connect to a substrate electrode a DC power supply for applying a DC voltage; to detect, with a floating potential detection means, a floating potential in a plasma discharge space, or to detect, with a radio frequency current detection means disposed between the substrate electrode and the DC power supply, a current value flowing through the substrate; and to control, with a substrate potential control means, the DC voltage applied to the substrate electrode based on the detected floating potential or current value (claim 5). (hereinafter referred to as patent document 2) has proposed to carry out sputtering with controlling the substrate potential to be substantially zero in order to prevent electrostatic breakdown of the thin film being sputtered.

Patent document 2 has further proposed to provide a control electrode at a position lateral to a sputter space formed between a target, which is connected to a sputter power supply for applying a negative voltage to generate plasma, and a substrate on a wafer stage, which is connected to a bias power supply which is an AC power supply for applying a desired biasing voltage (for example, a negative voltage or an AC voltage), and to carry out sputtering with the substrate being floated and applying to the control electrode a control voltage which makes the potential on the substrate be substantially zero volt (claim 1).

Theoretically, the composition of a film formed through sputtering should be substantially the same as the composition of a target. However, if the constituent elements of the film include an element with high vapor pressure, the element tends to be subject to reverse sputtering on the surface of the formed film, and this may often make it difficult to provide the film with substantially the same composition as the composition of the target.

The reverse sputtering is a phenomenon in which, if there is a large difference in ease of sputtering (sputter rate) among the constituent elements, one of the constituent elements which is more susceptible to sputtering than the other elements deposited on the substrate is preferentially sputtered out of the surface of the film, although the elements sputtered from the target have almost equal composition as the target.

For example, in PZT (lead zirconate titanate), which is a perovskite oxide with high ferroelectricity, or in a substitution system thereof, Pb is more susceptible to the reverse sputtering than Ti and Zr, and thus the Pb concentration in the film tends to be lower than the Pb concentration in the target. Also, in a perovskite oxide containing Bi or Ba at the A-site, these elements have high vapor pressure and thus have the similar tendency.

In Zn-containing compounds, Zn has high vapor pressure and thus has the similar tendency. For example, in a zinc oxide transparent conductive film or transparent semiconductor film, such as $InGaZnO_4$ (IGZO), which has excellent electric and optical characteristics comparable to indium tin oxide (ITO) and which is inexpensive and is an abundant resource, Zn is more susceptible to the reverse sputtering than the other constituent elements, and the Zn contents in the film composition tends to be lower than that in the target composition.

For the systems as presented in the above examples, in order to obtain a desired composition, countermeasures, such as using a target which contains the element susceptible to the reverse sputtering with an increased concentration, have been taken.

The present inventors have formed piezoelectric films of PZT or a substitution system thereof on substrates with 6-inch or more diameter using a commercially available sputtering device, and have found that the Pb concentration of the film varies in the in-plane direction. With a composition which is susceptible to the reverse sputtering, it is considered to be necessary to more strictly control film formation conditions to provide homogeneous conditions in the in-plane direction.

Patent documents 1 and 2 both pertain to sputtering film formation in general, and they do not mention piezoelectric films or Zn-containing compound films. Further, they provide no particular advantage to achieve homogenized film composition regardless of the composition of the film.

The above-described problem is not limited to the case of sputtering. Similar problem may occur in other film formation methods in which a substrate and a target are placed to face each other and a film containing the constituent elements of the target is formed on the substrate through a vapor-phase growth process using plasma. This problem is more apparent when the substrate size is larger, such as a substrate with 6-inch or more diameter.

SUMMARY OF THE INVENTION

In view of the above-described circumstances, the present invention is directed to providing a film formation method and a film formation device which are preferably applicable to a composition system, etc., susceptible to reverse sputtering, and allow high-level homogenization of film properties, such as composition, in the in-plane direction regardless of the composition of the formed film and the substrate size.

The present invention is further directed to providing a piezoelectric film which is formed with the above film formation method and has highly homogenized film properties, such as composition, in the in-plane direction.

A first aspect of the film formation method of the invention is a film formation method of forming, on a substrate, a film containing constituent elements of a target through a vapor deposition process using plasma with placing the substrate and the target to face each other, the method including: carrying out the film formation with controlling a potential in a spatial range of at least 10 mm extending laterally from the outer circumference of the substrate to be equal to a potential on the substrate.

A second aspect of the film formation method of the invention is a film formation method of forming, on a substrate, a film containing constituent elements of a target through a vapor deposition process using plasma with placing the substrate and the target to face each other, the method including: carrying out the film formation with surrounding the substrate with a wall surface having a potential controlled to be equal to a potential on the substrate.

The "potential" herein is measured through a single probe method or a triple probe method using a Langmuir probe. In principle, any other technique may be used as long as the potential can be measured.

In the first and second aspects of the film formation method of the invention, the film formation may be carried out with applying a positive (+) potential to the substrate.

An example of the vapor deposition process applicable to the invention is sputtering.

The invention is preferably applicable to a case where the film is a piezoelectric film.

The invention is preferably applicable to a case where the film is a piezoelectric film which contains, as a main component, one or two or more perovskite oxides represented by general formula (P) below:

wherein A represents an A-site element and includes at least one element selected from the group consisting of Pb, Ba, Sr, Bi, Li, Na, Ca, Cd, Mg, K, and lanthanide elements; B represents a B-site element and includes at least one element selected from the group consisting of Ti, Zr, V, Nb, Ta, Cr, Mo, W, Mn, Mg, Sc, Co, Cu, In, Sn, Ga, Zn, Cd, Fe, Ni, Hf and Al; and O represents oxygen, and wherein the molar ratio of the A-site element, the B site element and the oxygen element is 1:1:3 as a standard; however, the molar ratio may be varied from the standard molar ratio within a range where a perovskite structure is obtained.

The "main component" herein refers to a component whose content is at least 80 mol %.

The invention is preferably applicable to a case where the film contains one or two or more perovskite oxides represented by general formula (P), and the A-site element includes at least one metal element selected from the group consisting of Pb, Bi and Ba.

The invention is preferably applicable to a case where the film contains one or two or more perovskite oxides represented by general formula (P), and the A-site thereof contains Pb.

The invention is preferably applicable to a case where the film contains a Zn-containing compound.

The invention is preferably applicable to a case where the film contains a Zn-containing oxide represented by general formula below:

wherein M represents at least one element selected from the group consisting of In, Fe, Ga and Al, and all of x, y and z are real numbers greater than O.

A first aspect of the film formation device of the invention is a film formation device for forming, on a substrate, a film containing constituent elements of a target through a vapor deposition process using plasma, the device including: a vacuum vessel including therein a substrate holder and a target holder disposed to face to each other; plasma generating means for generating plasma within the vacuum vessel; and gas introducing means for introducing a gas to be plasmized into the vacuum vessel, wherein the substrate holder is larger than an outer circumference of the substrate by 10 mm or more in a direction lateral to the substrate, the substrate holder is connected to a potential controlling means for controlling a potential on the substrate holder, and a potential in a spatial range of at least 10 mm extending laterally from the outer circumference of the substrate is controllable to be equal to a potential on the substrate.

In the first aspect of the film formation device of the invention, the potential controlling means may include a power supply for applying a potential to the substrate holder, or an impedance circuit for controlling an impedance at the substrate holder.

In an aspect where the potential controlling means includes the impedance circuit, an end of the impedance circuit opposite from an end thereof connected to the substrate holder may be grounded or floated.

In an aspect where the potential controlling means includes the impedance circuit, the potential controlling means may further include an AC power supply, the AC power supply being connected to an end of the impedance circuit opposite from an end thereof connected to the substrate holder. In such an aspect, an end of the AC power supply opposite from an end thereof connected to the impedance circuit may be grounded.

In an aspect where the AC power supply is connected to an end of the impedance circuit opposite from an end thereof connected to the substrate holder, the AC power supply may be adapted such that power on or power off of the AC power supply, and the potential applied from the AC power supply to the impedance circuit are switchable.

In the first aspect of the film formation device of the invention, the substrate holder may include a plate-like holder body for receiving the substrate placed thereon and a securing member for securing an edge of the substrate, and the substrate holder and the securing member may be provided with an equal potential.

A second aspect of the film formation device of the invention is a film formation device for forming, on a substrate, a film containing constituent elements of a target through a vapor deposition process using plasma, the device including: a vacuum vessel including therein a substrate holder and a target holder disposed to face to each other; plasma generating means for generating plasma within the vacuum vessel; and gas introducing means for introducing a gas to be plasmized into the vacuum vessel, wherein the substrate holder is surrounded with a wall surface having a potential controllable to be equal to a potential on the substrate.

In the second aspect of the film formation device of the invention, the vacuum vessel may be connected to potential controlling means for controlling a potential on the vacuum vessel, and a potential at least on a surface of the vacuum vessel facing the substrate holder may be controllable to be equal to the potential on the substrate. The potential controlling means may include a power supply for applying a potential to the vacuum vessel, or an impedance circuit for controlling an impedance at the vacuum vessel.

In the second aspect of the film formation device of the invention, the substrate holder may be surrounded with a wall member, a potential on at least a surface of the wall member facing the substrate holder being controllable to be equal to the potential on the substrate.

The piezoelectric film of the invention is formed with the above-described first or second aspect of the film formation method of the invention.

According to the invention, a piezoelectric film can be provided, which contains one or two or more perovskite oxides represented by general formula (P) and has the A-site thereof containing Pb, which is formed according to the first or second aspect of the film formation method of the invention, and which has an in-plane variation of Pb concentration being within ±3.0%.

The piezoelectric device of the invention includes the above-described piezoelectric film of the invention, and an electrode for applying an electric field to the piezoelectric film.

The liquid discharge device of the invention includes the above-described piezoelectric device of the invention, and a liquid discharge member disposed adjacent to the piezoelectric device, the liquid discharge member including a liquid reservoir for storing a liquid, and a liquid discharge port for discharging the liquid from the liquid reservoir to the outside in response to application of the electric field to the piezoelectric film.

A piezoelectric ultrasonic transducer of the invention includes the above-described piezoelectric device of the invention; an AC power supply for applying an AC current to the electrode; and a vibrating plate vibrating along with expansion and contraction of the piezoelectric body.

According to the present invention, a film formation method and a film formation device can be provided, which are preferably applicable to a composition system, etc., susceptible to reverse sputtering and which allow high level homogenization of film properties, such as composition, in the in-plane direction regardless of the composition of a formed film and the size of a substrate.

According to the invention, a piezoelectric film with highly homogenized film properties, such as composition, in the in-plane direction formed with the above-described film formation method can be provided.

BRIEF DESCRIPTION OF THE DRAWINGS

FIG. 14 is a graph showing an energy distribution of argon ions plunging into a substrate of comparative example 1.

DESCRIPTION OF THE PREFERRED EMBODIMENTS

Film Formation Method

A first aspect of a film formation method according to the present invention is a film formation method of forming, on a substrate, a film containing constituent elements of a target through a vapor deposition process using plasma with placing the substrate and the target to face each other. The method includes carrying out the film formation with controlling a potential in a spatial range of at least 10 mm extending laterally from the outer circumference of the substrate to be equal to a potential on the substrate.

In the first aspect of the film formation method of the invention, it is preferable that a range of a space lateral to the substrate where the potential is equal to the potential on the substrate is as wide as possible. It is more preferable that the film formation is carried out with controlling the potential in a spatial range of at least 30 mm extending laterally from the outer circumference of the substrate to be equal to the potential on the substrate. It is particularly preferable that the film formation is carried out with controlling the potential in a spatial range of at least 50 mm extending laterally from the outer circumference of the substrate to be equal to the potential on the substrate.

Conventionally, the potential in the space lateral to the substrate has not particularly been controlled. It has been considered that the potential on the substrate placed on a conductive substrate holder is homogeneous in the in-plane direction of the substrate, and no consideration has been made on need of providing a homogeneous potential even in the space lateral to the substrate.

Figure 13:
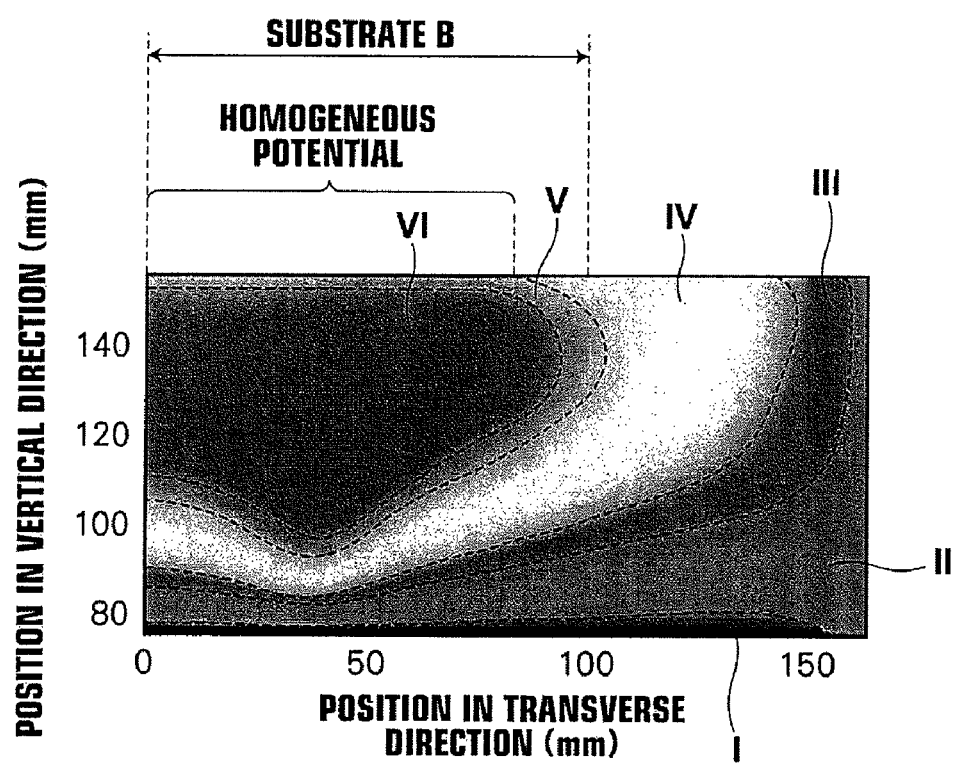
FIG. 13 is a graph showing a potential distribution of comparative example 1.

The present inventors have found that, when a film of PZT or a substitution system thereof is formed on a large substrate, such as one having a 6-inch or more diameter, under conventional conditions where the potential in the space lateral to the substrate is not particularly controlled, the potential at the outer circumference of the substrate is lower than the potential at the center of the substrate, and thus the potential in the in-plane direction of the substrate is inhomogeneous (see comparative example 1 and FIG. 13). At the outer circumference of the substrate, the plasma ions plunging into the substrate have large energy and the rate of reverse sputtering is increased, which leads to inhomogeneous composition distribution (see comparative example 1 and FIG. 14).

Figure 11:
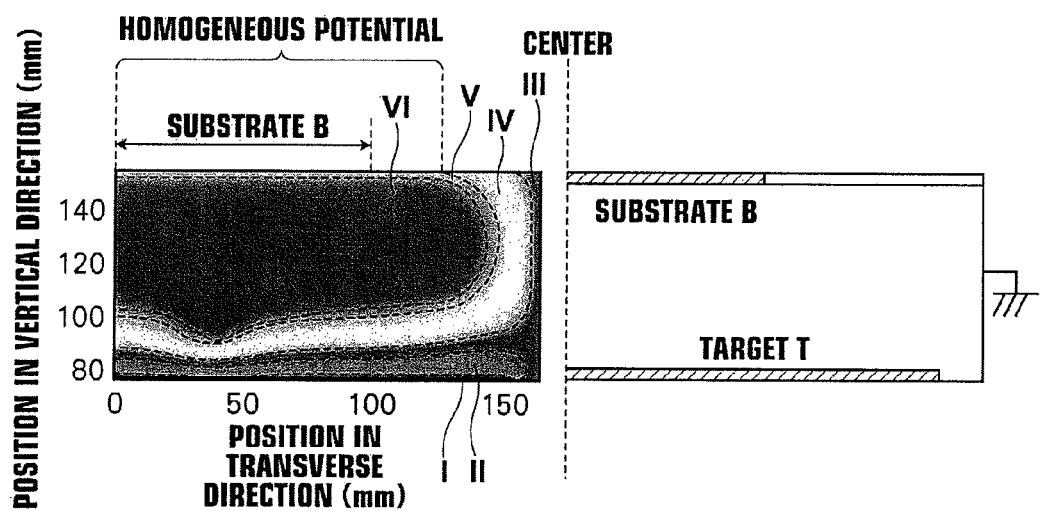
FIG. 11 shows a potential distribution of example 1.
Figure 12:
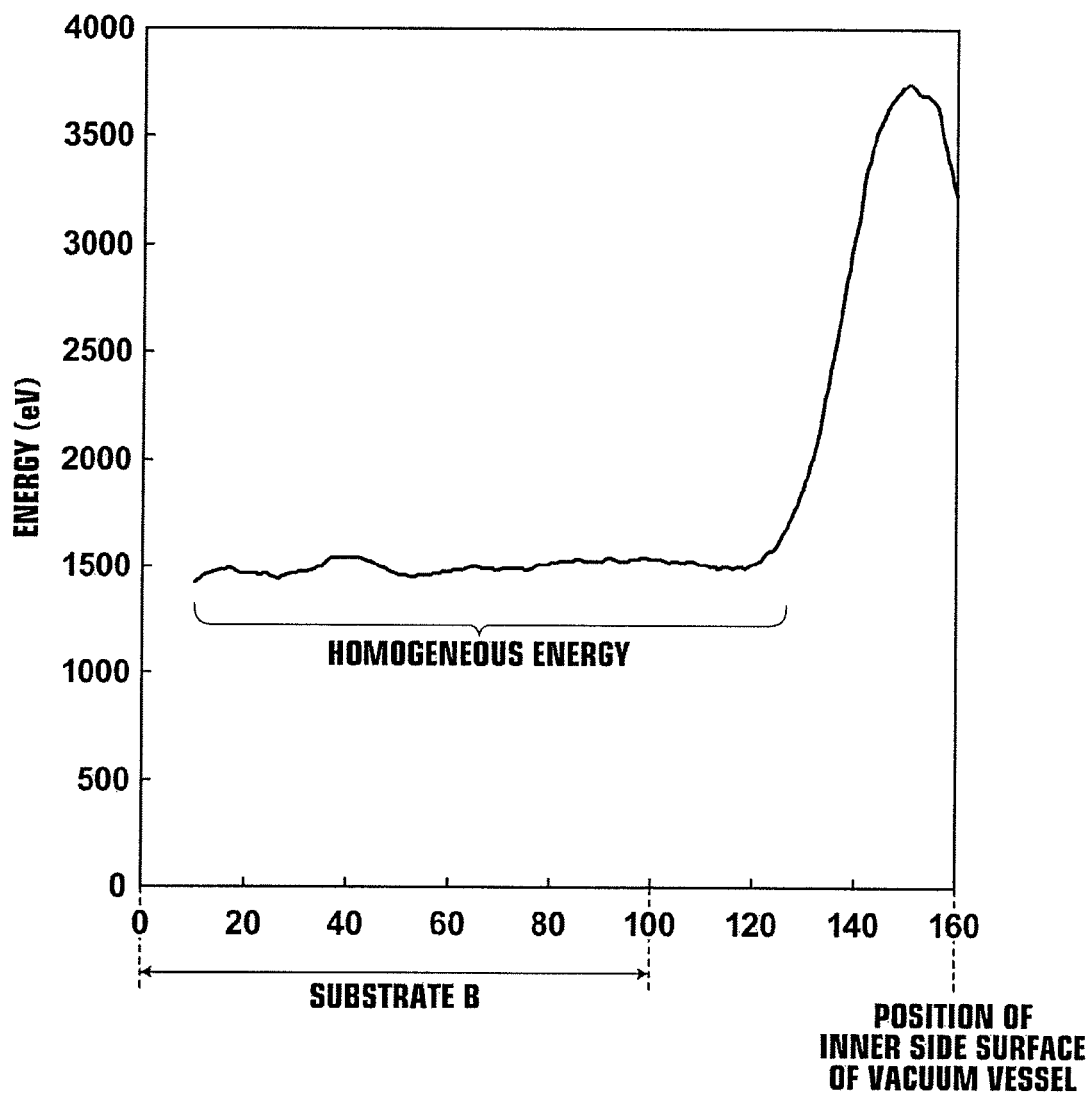
FIG. 12 is a graph showing an energy distribution of argon ions plunging into a substrate of example 1.

The present inventors have found that, by controlling the potential in the space lateral to the substrate to control the potential in the spatial range of at least 10 mm extending laterally from the outer circumference of the substrate to be equal to the potential on the substrate, the potential can be homogenized across the in-plane direction of the substrate, and thus the energy of the plasma ions plunging into the substrate can be homogenized across the in-plane direction of the substrate (see example 1, and FIGS. 11 and 12). According to the first aspect of the film formation method of the invention, the potential and the plasma ion energy can be homogenized across the in-plane direction of the substrate, thereby achieving high-level homogenization of film properties, such as composition, in the in-plane direction.

A second aspect of the film formation method of the invention is a film formation method of forming, on a substrate, a film containing constituent elements of a target through a vapor deposition process using plasma with placing the substrate and the target to face each other, the method including carrying out the film formation with surrounding the substrate with a wall surface having a potential controlled to be equal to a potential on the substrate.

Conventionally, no particular member is disposed in a space lateral to the substrate and between the substrate and the vacuum vessel, and the vacuum vessel is typically grounded. The present inventors have found that, when a film of PZT or a substitution system thereof is formed on a large substrate, such as one having a 6-inch or more diameter, under such conventional conditions, a large potential difference is produced between the substrate and an inner wall surface of the vacuum vessel surrounding the substrate, and the potential at the outer circumference of the substrate is lower than the potential at the center of the substrate, resulting in inhomogeneous potential in the in-plane direction of the substrate (see comparative example 1 and FIG. 13). At the outer circumference of the substrate, the plasma ions plunging into the substrate have large energy and the rate of reverse sputtering is increased, which leads to inhomogeneous composition distribution (see comparative example 1 and FIG. 14).

In the second aspect of the film formation method of the invention, the film formation is carried out with controlling the potential on the vacuum vessel to be equal to the potential on the substrate, or providing a wall member between the substrate and the vacuum vessel to control the potential at least on a surface of the wall member facing the substrate holder to be equal to the potential on the substrate so that the substrate is surrounded with the wall surface having the potential controlled to be equal to the potential on the substrate. The present inventors have found that, by controlling the potential around the substrate to be equal to the potential on the substrate, the potential can be homogenized across the in-plane direction of the substrate, and thus the energy of the plasma ions plunging into the substrate can be homogenized across the in-plane direction of the substrate. According to the second aspect of the film formation method of the invention, the potential and the plasma ion energy can be homogenized across the in-plane direction of the substrate, thereby achieving high-level homogenization of film properties, such as composition, in the in-plane direction.

The first and second aspects of the film formation method of the invention may be combined. In such an arrangement, the potential on the substrate, the potential in the space lateral to the substrate, and the potential around the substrate can be homogenized, and thus higher level homogenization of the potential and the plasma ion energy across the in-plane direction of the substrate can be achieved. The present invention is particularly effective when a substrate having a large diameter, such as a diameter of, specifically, three inches or more, six inches or more or eight inches or more, is used.

In the first and second aspects of the film formation method of the invention, the polarity of the potential applied to the substrate is not particularly limited. In the first and second aspects of the film formation method of the invention, the film formation may be carried out with applying a positive (+) potential to the substrate. Conventionally, it has been technical common knowledge in the art of vacuum film formation to apply a negative (−) potential to the substrate (see, for example, claim 1 of patent document 2). By applying a positive (+) potential to the substrate, however, a potential difference Vs−Vf (V) between a plasma potential Vs (V) in plasma and a floating potential Vf (V) during film formation can be reduced, and this provides good controllability of the film composition, thereby providing a film with good crystal quality. The reason of this is believed that, since the energy of the plasma ions, such as Ar ions, hitting the substrate surface during film formation can be kept low, the number of atoms re-sputtered from the substrate surface is reduced.

In the first and second aspects of the film formation method of the invention, a quantity of the potential applied to the substrate is not particularly limited. In the first and second aspects of the film formation method of the invention, the plasma space potential Vs (V) is not particularly limited, and is usually several tens V or more. Considering these points, the potential applied to the substrate may be +10 V or more, or optionally +20 V or more in order to reduce the energy of the plasma ions, such as Ar ions, flowing onto the substrate to minimize re-sputtering. If the potential applied to the substrate is too high, local electric discharge may occur at a point between the substrate and other site in the film formation device. Therefore, the potential applied to the substrate may be not more than +100 V.

The first and second aspects of the film formation method of the invention is applicable to film formation methods in which a substrate and a target are placed to face each other, and a film containing constituent elements of the target is formed on the substrate through vapor deposition using plasma.

Examples of the vapor deposition process to which the invention is applicable include sputtering processes, such as dipolar sputtering, tripolar sputtering, DC sputtering, radio frequency sputtering (RF sputtering), ECR sputtering, magnetron sputtering, facing target sputtering, pulse sputtering, and ion beam sputtering. Other examples of the vapor deposition process, besides the sputtering processes, to which the invention is applicable, include PLD, ion plating and plasma CVD.

The first and second aspects of the film formation method of the invention are applicable to formation of films having any composition, such as conductor films, semiconductor films, insulator films or dielectric films. In conventional film formation methods, the problem of inhomogeneous composition distribution tends to take place with a composition system, etc., which is susceptible to the reverse sputtering. The first and second aspects of the film formation method of the invention are preferably applicable to a composition system, etc., which is susceptible to the reverse sputtering, and allow high-level homogenization of film properties, such as composition, in the in-plane direction even with such a composition system.

The susceptibility to sputtering is often represented by sputter rate, such that the higher the sputter rate, the higher the susceptibility. The "sputter rate" is defined by a ratio between the number of incident ions and the number of sputtered atoms, and the unit is (atoms/ion).

With respect to the sputter film formation of PZT, which is a piezoelectric material, or a substitution system thereof, it has been known that, among the constituent elements Pb, Zr and Ti of PZT, Pb has the highest sputter rate, i.e., is most susceptible to sputtering. For example, Table 8.1.7 shown in "Shinku Handobukku (Handbook of Vacuum Technology)", edited by ULVAK, Inc., published by Ohmsha, Ltd., 1982, shows that the sputter rates under the condition of 300 eV Ar ions are: Pb=0.75, Zr=0.48 and Ti=0.65. This means that the susceptibility to sputtering of Pb is 1.5 times or more the susceptibility to sputtering of Zr.

The invention is preferably applicable to formation of a piezoelectric film.

The invention is preferably applicable to formation of a piezoelectric film containing, as a main component, one or two or more perovskite oxides represented by general formula (P) below:

$$ABO_3 \tag{P},$$

wherein A represents an A-site element and includes at least one element selected from the group consisting of Pb, Ba, Sr, Bi, Li, Na, Ca, Cd, Mg, K, and lanthanide elements; B represents a B-site element and includes at least one element selected from the group consisting of Ti, Zr, V, Nb, Ta, Cr, Mo, W, Mn, Mg, Sc, Co, Cu, In, Sn, Ga, Zn, Cd, Fe, Ni, Hf and Al; and O represents oxygen. The molar ratio of the A-site element, the B site element and the oxygen element is 1:1:3 as a standard; however, the molar ratio may be varied from the standard molar ratio within a range where a perovskite structure is obtained.

Examples of the perovskite oxides represented by general formula (P) include: lead-containing compounds, such as lead titanate, lead zirconate titanate (PZT), lead zirconate, lead lanthanum titanate, lead lanthanum zirconate titanate, lead magnesium niobate zirconium titanate, lead nickel niobate zirconium titanate and lead zinc niobate zirconium titanate, as well as mixed crystal systems thereof; and non-lead-containing compounds, such as barium titanate, strontium barium titanate, bismuth sodium titanate, bismuth potassium titanate, sodium niobate, potassium niobate and lithium niobate, as well as mixed crystal systems thereof.

In view of improvement of electrical characteristics, the perovskite oxide represented by general formula (P) may contain one or two or more metal ions, such as Mg, Ca, Sr, Ba, Bi, Nb, Ta, W, and Ln (=lanthanide elements: La, Ce, Pr, Nd, Sm, Eu, Gd, Tb, Dy, Ho, Er, Tm, Yb, and Lu).

The invention is preferably applicable to formation of a film containing one or two or more perovskite oxides represented by general formula (P) and having the A-site element which is at least one metal element selected from the group consisting of Pb, Bi and Ba. Pb, Bi or Ba is an element having high vapor pressure and is susceptible to the reverse sputtering.

Examples of the perovskite oxide represented by general formula (P) and containing Pb include lead titanate, lead zirconate titanate (PZT), lead zirconate, lead lanthanum titanate, lead lanthanum zirconate titanate, lead magnesium niobate zirconium titanate, and lead nickel niobate zirconium titanate.

According to the invention, a piezoelectric film can be provided, which contains one or two or more perovskite oxides represented by general formula (P) and has the A-site thereof containing Pb, which is formed according to the first or second aspect of the film formation method of the invention, and which has variation of the Pb concentration in the in-plane direction being within ±3.0%.

Examples of the perovskite oxide represented by general formula (P) and containing Bi or Ba include barium titanate, barium strontium titanate, barium titanate zirconate, bismuth sodium titanate, bismuth potassium titanate, bismuth ferrite, bismuth ferrite lanthanum, and bismuth ferrite barium.

The invention is preferably applicable to formation of a film containing a Zn-containing compound. Zn is also an element having high vapor pressure and being susceptible to the reverse sputtering.

The invention is preferably applicable to formation of a film containing a Zn-containing oxide represented by general formula (S) below:

$$In_xM_yZn_zO_{(x+3y/2+3z/2)} \tag{S},$$

where M represents at least one element selected from the group consisting of In, Fe, Ga and Al. All of x, y and z are real numbers greater than 0.

Examples of the Zn-containing oxide represented by general formula (S) include $InGaZnO_4$ (IGZO) and $ZnIn_2O_4$, which are used as a transparent conductive film or a transparent semiconductor film in various applications.

As described above, according to the first and second aspects of the film formation method of the invention, the potential can be homogenized across the in-plane direction of the substrate, and the energy of the plasma ions plunging into the substrate can be homogenized across the in-plane direction of the substrate, thereby achieving high-level homogenization of film properties, such as composition, in the in-plane direction.

The first and second aspects of the film formation method of the invention are preferably applicable to a composition system, etc., which is susceptible to the reverse sputtering, and allow high-level homogenization of film properties, such as composition, in the in-plane direction, regardless of the composition of the formed film and the substrate size.

Film Formation Device of First Embodiment

Figure 1:
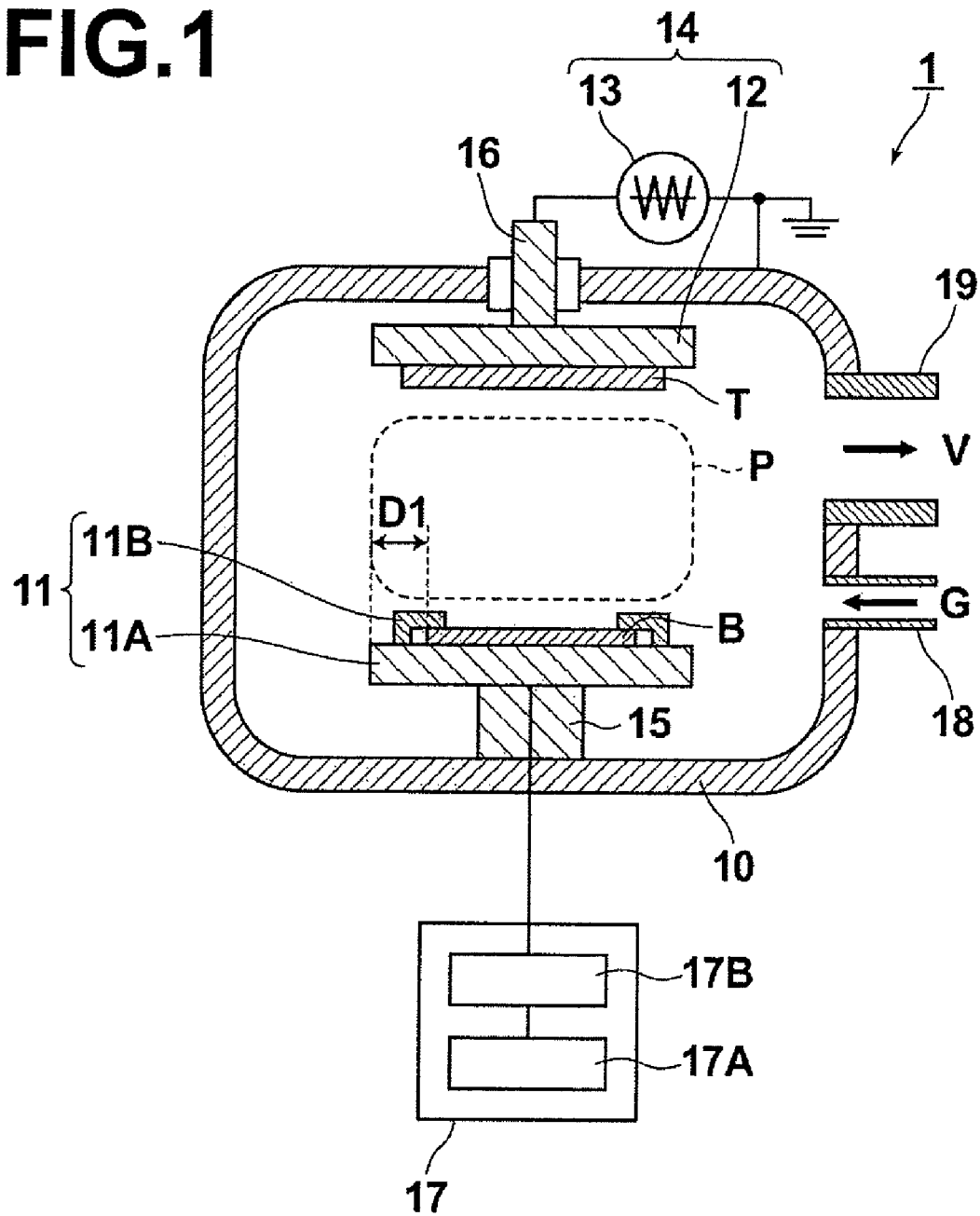
FIG. 1 is a sectional view illustrating the entire structure of a film formation device according to a first embodiment of the invention.

A film formation device according to a first embodiment of the invention is described with reference to the drawings. FIG. 1 is a sectional view illustrating the entire structure of the device. In this embodiment, the description is given in conjunction with radio frequency sputtering (RF sputtering), as an example.

A film formation device 1 shown in FIG. 1 generally includes a vacuum vessel 10, which includes therein a substrate holder 11, on which a substrate B can be loaded and the loaded substrate B can be heated to a predetermined temperature; and a target holder 12, on which a target T can be loaded. In the device of this embodiment, the interior of the vacuum vessel 10 forms a film formation chamber. In the vacuum vessel 10, the substrate holder 11 and the target holder 12 are spaced from each other to face to each other. The vacuum vessel 10 is made of a conductor, such as stainless steel, and is grounded.

The substrate B is not particularly limited, and may be selected as appropriate from various substrates according to the use, such as Si substrates, oxide substrates, glass substrates, and various types of flexible substrates. The substrate B may be the above-described substrate and may be provided with any film, such as an electrode, formed thereon. The composition of the target T is selected according to the composition of the film to be formed.

In the film formation device 1, the gas G introduced into the vacuum vessel 10 is plasmized through electric discharge from a plasma electrode (in this embodiment, the target holder 12 serves as the plasma electrode), and positive ions, such as Ar ions, generate. The generated positive ions sputter the target T. Constituent elements of the target T sputtered by the positive ions are released from the target and deposited on the substrate B in the neutral or ionized state. In the drawing, the plasma space is schematically indicated by the symbol "P".

The film formation device 1 includes a gas introducing means for introducing a gas G to be plasmized into the vacuum vessel 10. The gas introducing means includes a supply source (not shown) for supplying the gas G to be plasmized, and a gas inlet tube 18 for introducing the gas G supplied from the supply source into the vacuum vessel 10. The film formation device 1 further includes a gas outlet tube 19, which is connected to an exhaust means (not shown), such a vacuum pump, to discharge (indicated by "V" in the drawing) the gas from the vacuum vessel 10. The connection points of the gas inlet tube 18 and the gas outlet tube 19 to the vacuum vessel 10 may be designed as appropriate. However, it is preferable that the gas inlet tube 18 and the gas outlet tube 19 are provided such that the gas concentration in the vacuum vessel 10 is as homogeneous as possible. The gas G is not particularly limited, and may be Ar, Ar/O$_2$ mixed gas, etc.

The film formation pressure is not particularly limited; however, the film formation pressure may be 10 Pa or less. If the film formation pressure is higher than 10 Pa, ratio of the particles sputtered out from the target T and reaching the substrate B may be decreased due to scattering, etc., depending on the types of the elements. If the film formation pressure is 10 Pa or less, the condition of the plasma space is between an intermediate flow, which is intermediate between the molecule flow and the viscous flow, and the molecule flow, and therefore possibility of the particles sputtered out from the target T to be scattered before they reach the substrate B is negligibly low regardless of the types of the elements.

The substrate holder 11 generally includes: a plate-like holder body 11A, on which the substrate B is placed; and a securing member 11B, which is attached to the holder body 11A and secures edge portions of substrate B. The substrate holder 11 is held by a holding member 15, which is attached to the inner bottom surface of the vacuum vessel 10.

The holder body 11A, the securing member 11B and the holding member 15 are made of a conductor, such as stainless steel. The holding member 15 and the vacuum vessel 10 are insulated from each other via an insulating material (the insulating material is not shown). The substrate holder 11 is electrically connected to a DC current applying unit (potential controlling means) 17, which is provided externally to the vacuum vessel 10, so that a potential can be applied to the substrate holder 11, and the potential is controllable. The DC current applying unit 17 generally includes a DC power supply 17A and a matching circuit 17B. The matching circuit 17B is provided optionally. The matching circuit 17B disposed between the DC power supply 17A and the substrate holder 11 facilitates control of the potential on the substrate holder 11.

In this embodiment, the holder body 11A, the securing member 11B and the holding member 15 have an equal potential. In this embodiment, where a DC bias current is applied to the substrate holder 11, the substrate itself may be a conductor, or a conductor film, such as an electrode, may be formed on the substrate surface when the substrate is an insulator. In this arrangement, the substrate B and the substrate holder 11 can effectively be provided with an equal potential. When a film, such as a piezoelectric film, is formed, a lower electrode is usually formed as an underlying layer, and thus an equal potential can be provided on the substrate and on the substrate holder 11.

In this embodiment, the size of the holder body 11A of the substrate holder 11 is designed to be larger than the substrate B by 10 mm or more from the outer circumference of the substrate B in a direction lateral to the substrate B. That is, a distance D1 between the outer circumference of the substrate B and the outer circumference of the substrate holder 11 is 10 mm or more. In this embodiment, this design allows to control the potential in the spatial range of at least 10 mm extending laterally from the outer circumference of the substrate B to be equal to the potential on the substrate B. In this embodiment, $D1 \geq 10$ mm, optionally $D1 \geq 30$ mm, and further optionally $D1 \geq 50$ mm.

The target holder 12 is formed by a plate-like holder body, on which the target T is placed, and is held by a holding member 16 attached to the vacuum vessel 10. The holding member 16 and the vacuum vessel 10 are insulated from each other via an insulating material. The holding member 16 is connected to a radio frequency AC power supply (RF power supply) 13, which is provided externally to the vacuum vessel 10, and serves as a plasma electrode (cathode electrode) for the target holder 12 to generate plasma. An end of the RF power supply 13 opposite from the end thereof connected to the target holder is grounded.

In this embodiment, the RF power supply 13 and the target holder 12 serving as the plasma electrode (cathode electrode) form a plasma generating means 14 for generating plasma in the vacuum vessel 10.

The structure of the film formation device 1 of this embodiment is as described above. By using the film formation device 1 of this embodiment, the first aspect of the film formation method of the invention can be implemented. That is, the film formation can be carried out with controlling the potential in the spatial range of at least 10 mm extending laterally from the outer circumference of the substrate B to be equal to the potential on the substrate B. According to this embodiment, the potential can be homogenized across the in-plane direction of the substrate, and the energy of the plasma ions plunging into the substrate can be homogenized across the in-plane direction of the substrate, thereby achieving high-level homogenization of film properties, such as composition, in the in-plane direction.

Film Formation Device of Second Embodiment

Figure 2:
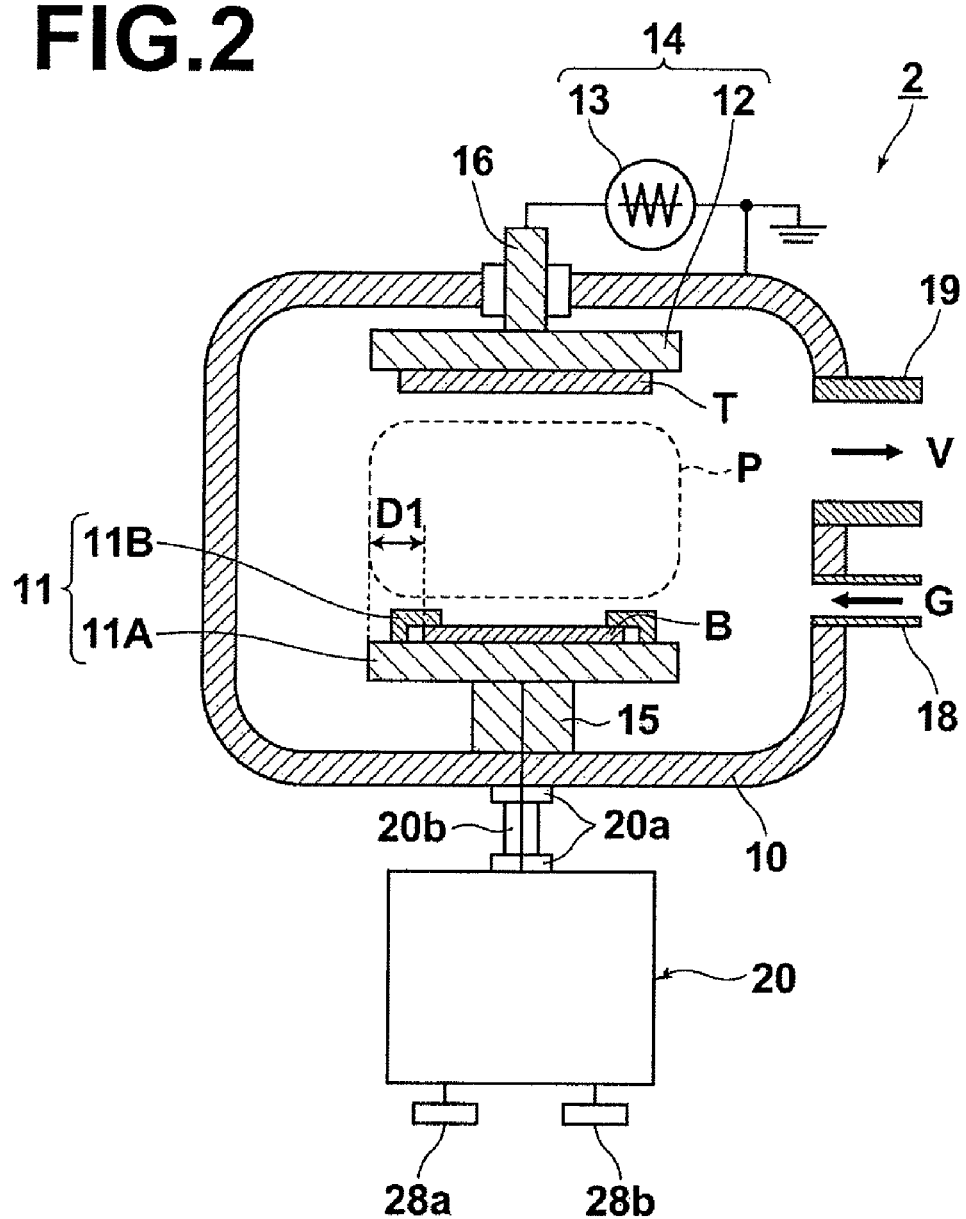
FIG. 2 is a sectional view illustrating the entire structure of a film formation device according to a second embodiment of the invention.
Figure 3:
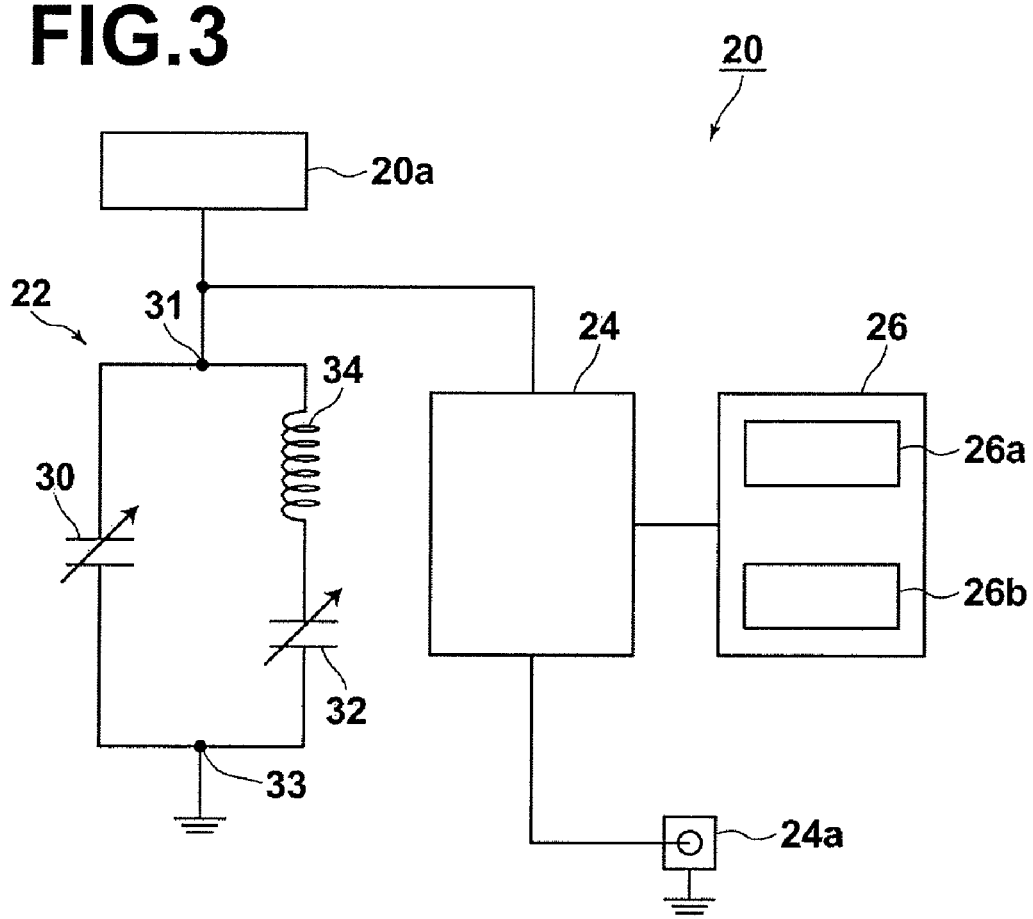
FIG. 3 is a circuit diagram of an impedance controller.

A film formation device according to a second embodiment of the invention is described with reference to the drawings. FIG. 2 is a sectional view illustrating the entire structure of the device. FIG. 3 is a circuit diagram illustrating the configuration of an impedance controller 20. The components which are the same as those in the first embodiment are denoted by the same reference numerals and explanation thereof is omitted.

The main structure of the film formation device 2 of this embodiment is similar to that of the device of the first embodiment, except that the impedance controller 20 is provided in place of the DC current applying unit 17 as the potential controlling means connected to the substrate holder 11.

Also in this embodiment, the size of the holder body 11A of the substrate holder 11 is designed to be larger than the substrate B by 10 mm or more from the outer circumference of the substrate B in a direction lateral to the substrate B. That is, the distance D1 between the outer circumference of the substrate B and the outer circumference of the substrate holder 11 is 10 mm or more. In this embodiment, this design allows to control the potential in the spatial range of at least 10 mm extending laterally from the outer circumference of the substrate B to be equal to the potential on the substrate B. Also in this embodiment, $D1 \geqq 10$ mm, optionally $D1 \geqq 30$ mm, and further optionally $D1 \geqq 50$ mm.

In this embodiment, the vacuum vessel 10 is grounded, and the substrate holder 11, which is electrically insulated from the vacuum vessel 10, is electrically floated.

In typical sputter devices, the substrate is usually grounded potential or floated. When the substrate is floated, it is floated in terms of direct current, but has a certain impedance in terms of alternative current (for example, 13.56 MHz). The substrate potential can be controlled by positively controlling this impedance. In this embodiment, the impedance controller 20 is adapted to control the impedance at the substrate holder 11 and the substrate B.

Types of impedance controllers include π-type, L-type, step-up transformer-type, and tuned transformer-type. Any type of impedance controller may be used as long as it can control the substrate potential. In this embodiment, a π-type impedance controller is used as an example.

The impedance controller 20 is provided externally to the vacuum vessel 10. One end of the impedance controller 20 is grounded, and the other end of the impedance controller 20 is connected to the substrate holder 11 via an HN connector 20a. The impedance controller 20 includes: an impedance circuit 22, which can control the impedance at the substrate holder 11; a detection circuit 24, which measures the substrate potential at the impedance circuit 22 (specifically, a DC component Vdc of a potential between the substrate potential and the ground potential); a display unit 26, which displays the result of detection by the detection circuit 24; and control knobs 28a and 28b for controlling an impedance at the impedance circuit 22. By operating at least one of the control knobs 28a and 28b of the impedance controller 20 to control the impedance at the impedance circuit 22, the impedance at the substrate holder 11 is controlled.

The impedance circuit 22 is formed, for example, by a vacuum variable condenser having a variable electric capacitance (electrostatic capacitance), and includes a first variable condenser 30 and a second variable condenser 32, which are connected in parallel to each other, as well as a coil 34, which is connected in series to the second variable condenser 32. One end of the first variable condenser 30 is connected to one end of the coil 34, which is connected in parallel to the first variable condenser 30, and a connection point 31 between the first variable condenser 30 and the coil 34 is connected to the substrate holder 11 in the vacuum vessel 10 via the connector 20a, such as an HN connector, and a coaxial cable 20b, and further via the connector 20a and the coaxial cable 20b attached to the vacuum vessel 10. The other end of the coil 34 is connected in series to one end of the second variable condenser 32. The other end of the second variable condenser 32 is connected to the other end of the first variable condenser 30, which is connected in parallel to the second variable condenser 32, and a connection point 33 between the second variable condenser 32 and the first variable condenser 30 is grounded.

The control knobs 28a and 28b are respectively coupled to the first variable condenser 30 and the second variable condenser 32, so that the electrostatic capacitance at the first variable condenser 30 and the second variable condenser 32 can respectively be varied via operation of the control knobs 28a and 28b, and thus the impedance at the impedance circuit 22 can be varied.

One end of the detection circuit 24 is connected to a point between the connection point 31 and the HN connector 20a, and the other end of the detection circuit 24 is grounded via a connector 24a, such as a BNC connector.

The detection circuit 24 measures and detects a potential (DC component Vdc) at the connection point 31 of the impedance circuit 22, to measure the substrate potential (the DC component Vdc of the potential between the substrate potential and the ground potential). The detection circuit 24 may be any of conventionally known potential detection circuits, as long as it can measure the potential at the connection point 31 of the impedance circuit 22.

The display unit 26 displays the result of detection by the detection circuit 24 for monitoring the result, and includes a substrate potential display section 26a for displaying the measured substrate potential. The display unit 26 may optionally include a cleaning time display section 26b, which displays an appropriate time for cleaning the interior of the vacuum vessel 10, which is determined by calculating deposition amount and deposition degree of the constituent elements of the target T onto the inner surface of the vacuum vessel 10, based on the measured substrate potential.

The detection circuit 24 and the display unit 26 may not be built in the impedance controller 20. The detection circuit 24 and the display unit 26 may be provided externally to the impedance controller 20, or may be connected to the impedance circuit 22 only when the substrate potential is measured. Such design change may be made as appropriate.

By using the film formation device 2 of this embodiment, the first aspect of the film formation method of the invention can be implemented. That is, the film formation can be carried out with controlling the potential in the spatial range of at least 10 mm extending laterally from the outer circumference of the substrate B to be equal to the potential on the substrate B. According to this embodiment, the potential can be homogenized across the in-plane direction of the substrate, and the energy of the plasma ions plunging into the substrate can be homogenized across the in-plane direction of the substrate, thereby achieving high-level homogenization of film properties, such as composition, in the in-plane direction.

Modification Examples of Film Formation Device of Second Embodiment

Modification examples of the second embodiment are described with reference to the drawings. FIGS. 4A-4D correspond to FIG. 3.

Figure 4A:
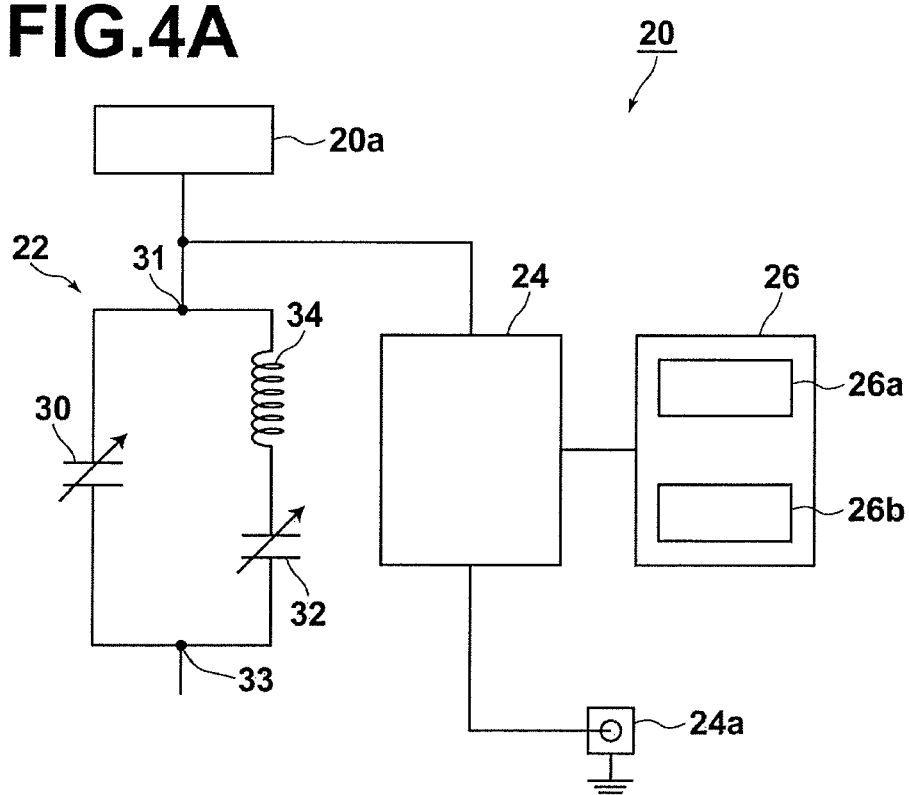
FIG. 4A is a diagram illustrating a modification example of the second embodiment.

In the above-described second embodiment, the connection point 33 of the impedance circuit 22 at the side which is not connected to the substrate holder 11 is grounded. However, as shown in FIG. 4A, the connection point 33 may not be provided with a particular potential, and may be floated. The control of the substrate potential by the impedance circuit 22 can also be achieved in this configuration.

Figure 4B:
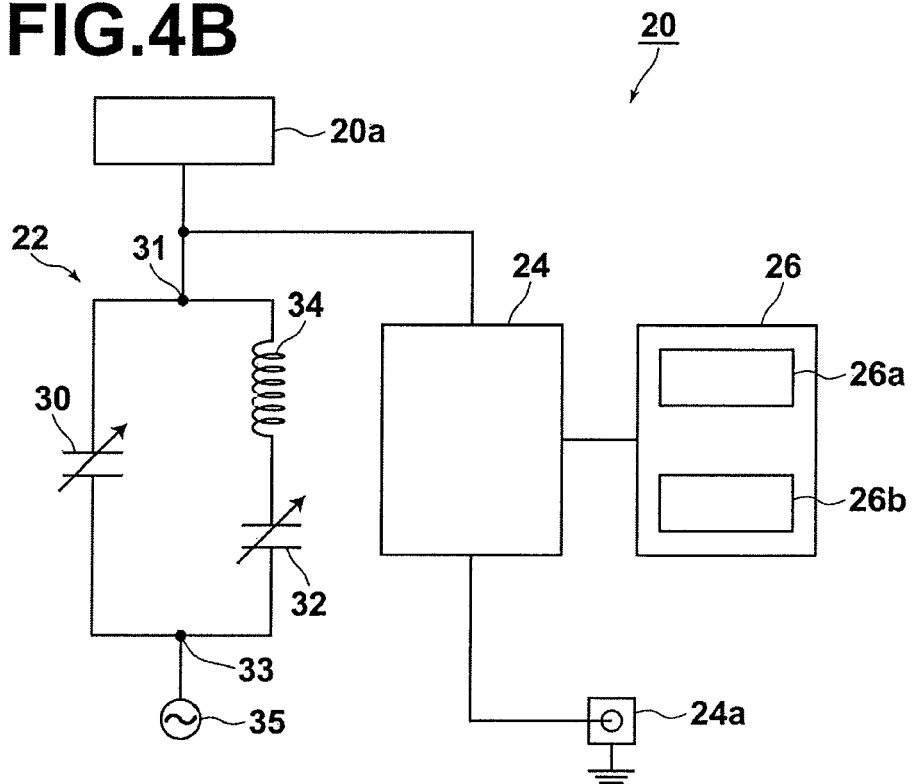
FIG. 4B is a diagram illustrating another modification example of the second embodiment.
Figure 4C:
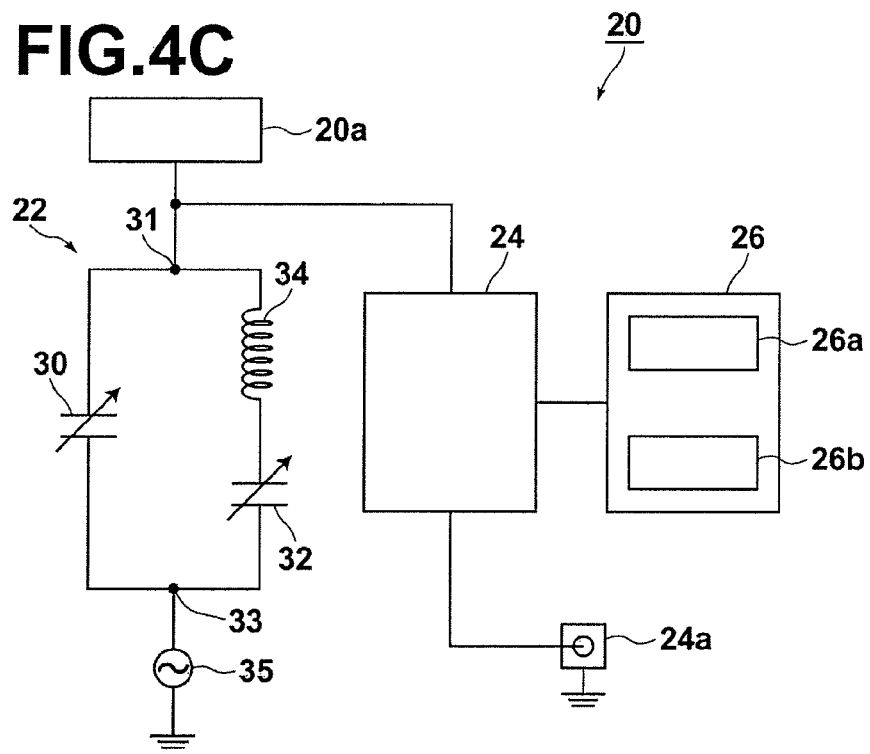
FIG. 4C is a diagram illustrating yet another modification example of the second embodiment.

As shown in FIG. 4B, a radio frequency AC power supply (RF power supply) 35 may be connected to the connection point 33. As shown in FIG. 4C, an end of the RF power supply 35 which is not connected to the impedance circuit 22, in the aspect shown in FIG. 4B, may be grounded. As shown in FIG.

4D, a matching circuit 36 may further be provided between the connection point 33 and the RF power supply 35 in the aspect shown in FIG. 4C. Similarly to the modification example shown in FIG. 4D, the aspect shown in FIG. 4B may further include the matching circuit 36 (not shown) provided between the connection point 33 and the RF power supply 35.

In the examples shown in FIGS. 4B-4C, the impedance circuit 22 and the RF power supply 35 serve as the potential controlling means for controlling the substrate potential. In the example shown in FIG. 4D, the impedance circuit 22, the matching circuit 36 and the RF power supply 35 serve as the potential controlling means for controlling the substrate potential.

Figure 4D:
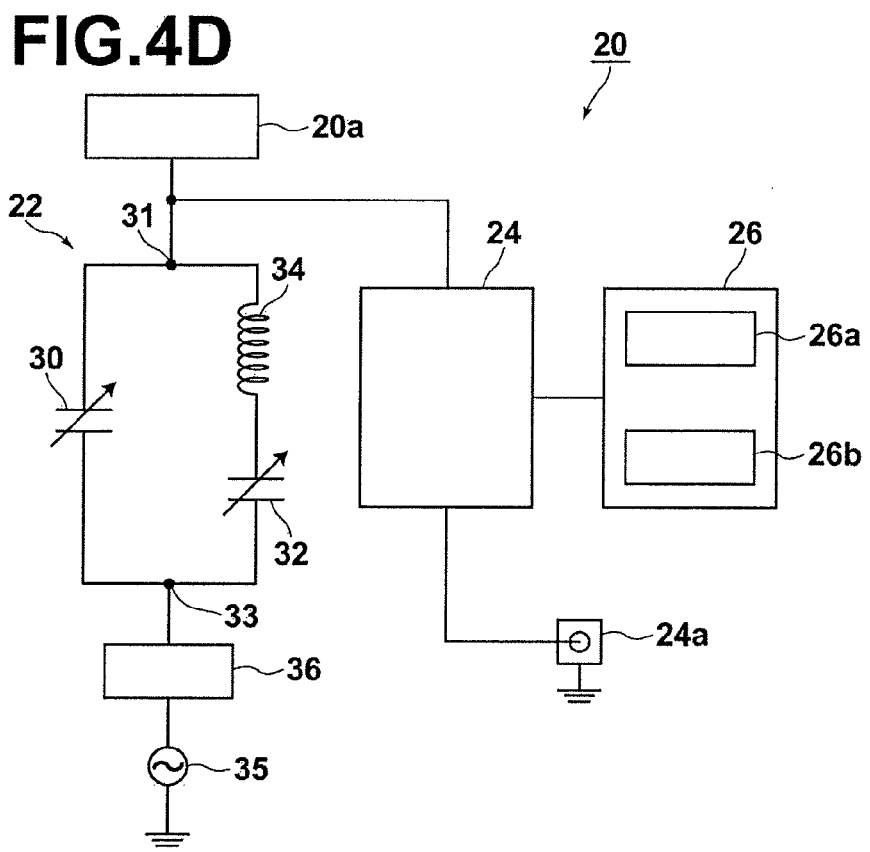
FIG. 4D is a diagram illustrating still another modification example of the second embodiment.

In the aspects shown in FIGS. 4B-4D, where the RF power supply 35 is connected to the connection point 33 of the impedance circuit 22 at the side which is not connected to the substrate holder 11, the substrate potential can be controlled in a wider range than in the aspect where the substrate potential is controlled only with the impedance circuit 22. In such aspects, in particular, the substrate potential is controllable in a range which is wider toward the negative potential side, and thus the controllable range of the substrate potential can be widened. For example, the substrate potential may be controlled in the range of −10 V or more, in the range of −20 V or more, or even in the range with the lower limit being further lower. The upper limit of the substrate potential is not particularly limited; however, the upper limit of the substrate potential may be not more than +100 V.

The potential applied by the RF power supply 35 to the impedance circuit 22 may be fixed. Power on or power off of the RF power supply 35 and the potential applied by the RF power supply 35 to the impedance circuit 22 may be switchable. That is, the device may be used with the RF power supply 35 being powered on or powered off, and the power on or power off of the RF power supply 35 may be switchable as necessary. When the device is used with the RF power supply 35 being powered on, the applied potential may be controllable as necessary. In this configuration, control of the substrate potential with the impedance circuit 22 and the RF power supply 35 can be performed in a wider range depending on the composition of the film to be formed and film formation conditions, such as the film formation temperature.

In the configuration where the RF power supply 35 is connected to the connection point 33 of the impedance circuit 22 at the side thereof which is not connected to the substrate holder 11, the substrate potential can be controlled to be a desired value by controlling the electric power applied to the impedance controller 20 and/or the RF power supply 35 and the phase of the RF power supply 35 and the RF power supply 13 for sputtering while the substrate potential is measured, for example.

Film Formation Device of Third Embodiment

Figure 5:
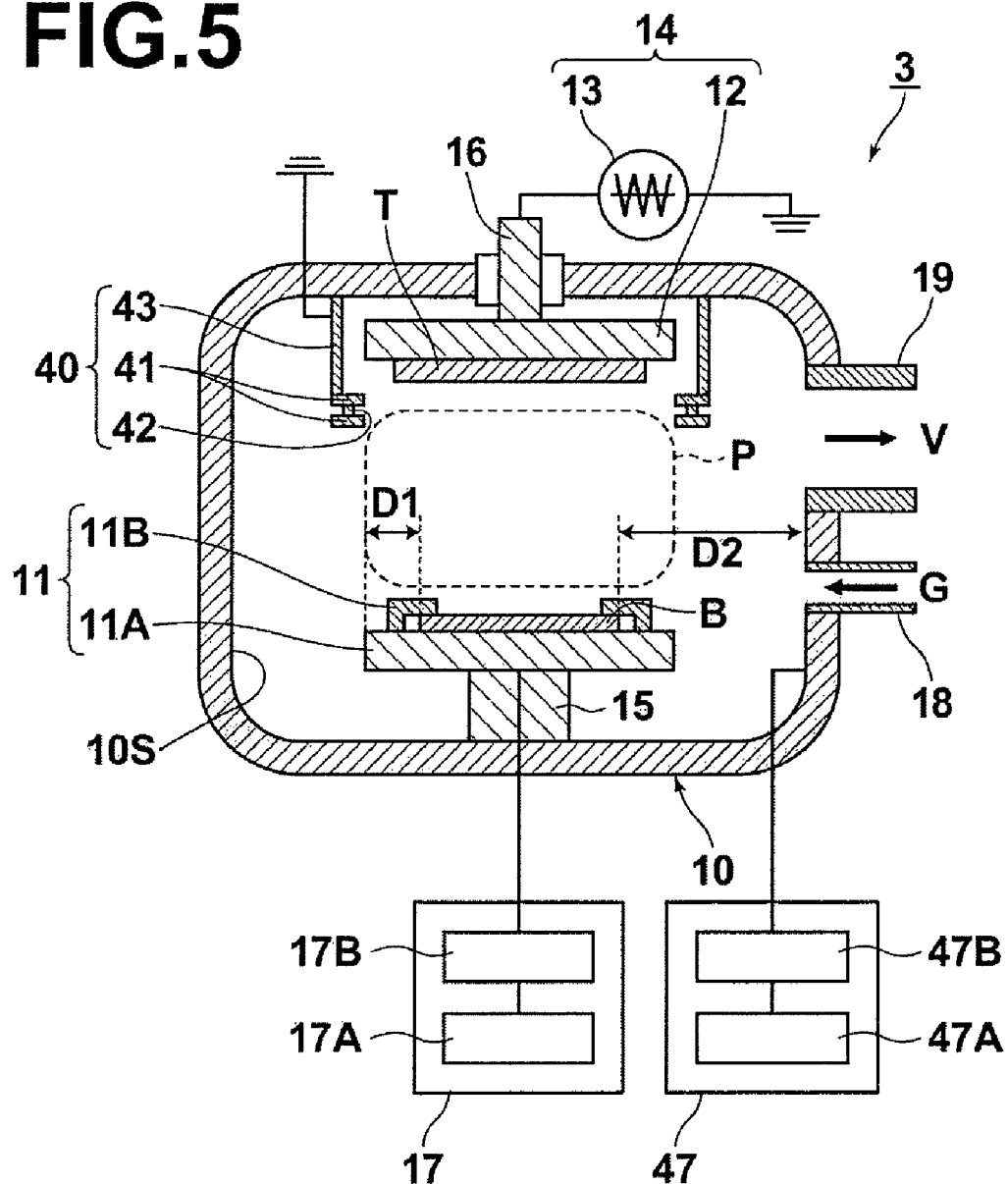
FIG. 5 is a sectional view illustrating the entire structure of a film formation device according to a third embodiment of the invention.

A film formation device according to a third embodiment of the invention is described with reference to the drawings. FIG. 5 is a sectional view illustrating the entire structure of the device. The components which are the same as those in the first embodiment are denoted by the same reference numerals and explanation thereof is omitted.

In a film formation device 3 of this embodiment, similarly to the device of the first embodiment, the substrate holder 11 is electrically connected to the DC current applying unit (potential controlling means) 17 provided externally to the vacuum vessel 10, so that a potential can be applied to the substrate holder 11, and the potential is controllable. Also, the size of the holder body 11A of the substrate holder 11 is designed to be larger than the substrate B by 10 mm or more from the outer circumference of the substrate B in a direction lateral to the substrate B. That is, the distance D1 between the outer circumference of the substrate B and the outer circumference of the substrate holder 11 is 10 mm or more. In this embodiment, this design allows to control the potential in the spatial range of at least 10 mm extending laterally from the outer circumference of the substrate B to be equal to the potential on the substrate B. Also in this embodiment, D1≧10 mm, optionally D1≧30 mm, and further optionally D1≧50 mm.

In this embodiment, the vacuum vessel 10 is electrically connected to a DC current applying unit (potential controlling means) 47, which is provided externally to the vacuum vessel 10, so that the potential can be applied to the vacuum vessel 10, and the potential is controllable. The DC current applying unit 47 generally includes a DC power supply 47A and a matching circuit 47B. The matching circuit 47B is provided optionally. The matching circuit 47B disposed between the DC power supply 47A and the vacuum vessel 10 facilitates control of the potential on the vacuum vessel 10. In this embodiment, a potential is applied to the vacuum vessel 10 to control the potential at least on an inner wall surface 10S of the vacuum vessel 10 to be equal to the potential on the substrate B. That is, in this embodiment, the film formation is carried out with surrounding the substrate B with the inner wall surface 10S, which has the potential controlled to be equal to the potential on the substrate B, of the vacuum vessel 10.

A distance D2 between the outer circumference of the substrate B and the inner wall surface 10S of the vacuum vessel 10 is not particularly limited. In view of effectively providing the potential control effect, the distance D2 may be 20 mm or more, or may optionally be 50 mm or more. The distance D2 may be even larger; however, in view of available space within the device, the distance D2 may be less than 150 mm.

In this embodiment, the vacuum vessel 10 and the substrate holder 11 are connected to the different DC current applying units. However, the vacuum vessel 10 and the substrate holder 11 may be connected to the same DC current applying unit as long as the potential on the substrate B and the potential on the vacuum vessel 10 can be controlled to be equal.

In this embodiment, since a potential is applied to the vacuum vessel 10, a shield 40 having the ground potential is provided around the target holder 12.

The shield 40 includes metal rings 41, which are disposed on the side of the target T nearer to the substrate B to surround the outer circumference of the target T, spacers 42 disposed between the metal rings 41, and a holding member 43, which is attached on the inner surface of the vacuum vessel 10 to hold the metal rings 41. The metal rings 41, the spacers 42 and the holding member 43 are made of a conductive material, such as stainless steel. The number of the metal rings 41 is not particularly limited, and is two in the example shown in the drawing. The number of the metal rings 41 may be changed as necessary. The spacers 42 are disposed along the circumferential direction of the metal rings 41 with being spaced from each other to form clearances to facilitate flow of the gas G between the adjacent spacers 42. The holding member 43 and the vacuum vessel 10 are insulated from each other via an insulating material, and the holding member 43 is grounded (the insulating material is not shown).

By providing the shield 40 having the ground potential around the target T, spread of the plasma can be minimized, and the plasma potential in the vicinity of the target T can be controlled. See U.S. Patent Application Publication No. 20080081128 of the present applicant for details of structure and function of the shield 40.

By using the film formation device 3 of this embodiment, the first and second aspects of the film formation method of the invention can be implemented. That is, the film formation can be carried out with controlling the potential in the spatial range of at least 10 mm extending laterally from the outer circumference of the substrate B to be equal to the potential on the substrate B. Further, the film formation can be carried out with surrounding the substrate B with a wall surface (in this embodiment, the inner wall surface 10S of the vacuum vessel 10) having the potential which is controlled to be equal to the potential on the substrate. According to this embodiment, the potential can be homogenized across the in-plane direction of the substrate and the energy of the plasma ions plunging into the substrate can be homogenized across the in-plane direction of the substrate, thereby achieving high-level homogenization of film properties, such as composition, in the in-plane direction.

In this embodiment, in place of the DC current applying unit 47, the impedance controller 20 shown in the second embodiment may be connected to the vacuum vessel 10. In this case, by connecting the impedance controller 20 to the vacuum vessel 10 with at least a part of the vacuum vessel 10 being floated from the ground potential, the potential on the vacuum vessel 10 can be controlled to be equal to the potential on the substrate B.

The film formation device described in this embodiment can simultaneously implement the first and second aspects of the film formation method of the invention. However, if the potential in the space lateral to the substrate is not controlled to be equal to the potential on the substrate, only the second aspect of the film formation method of the invention can be implemented.

Film Formation Device of Fourth Embodiment

Figure 6:
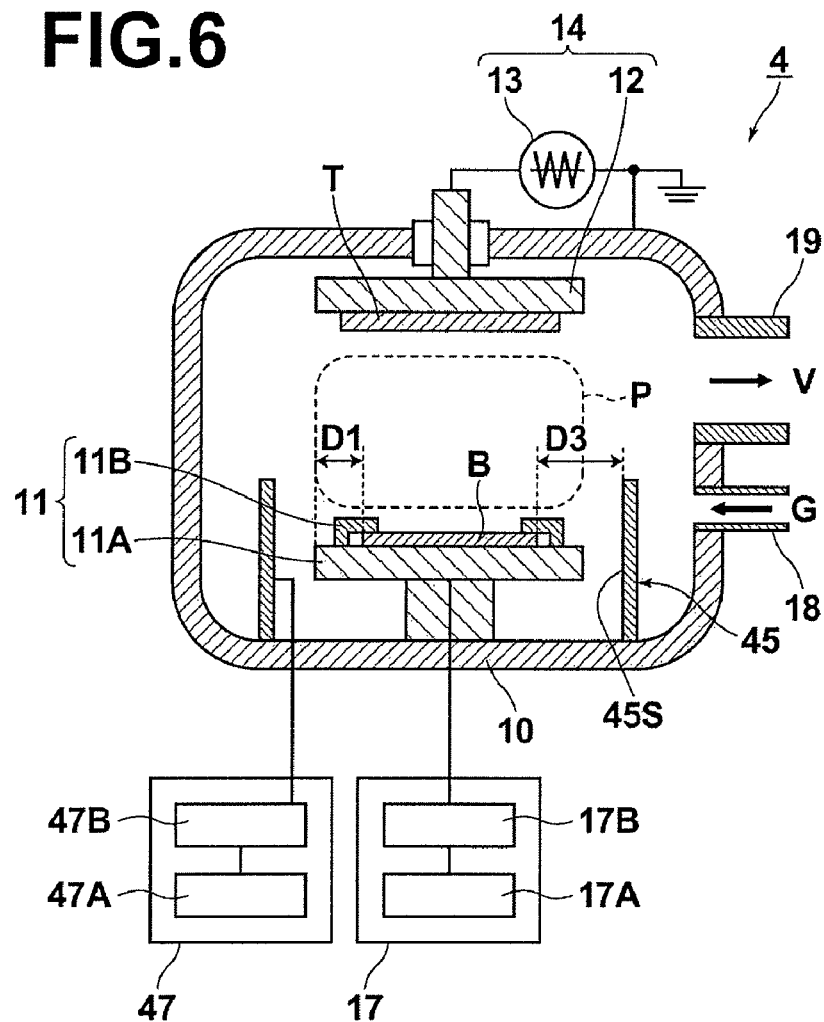
FIG. 6 is a sectional view illustrating the entire structure of a film formation device according to a fourth embodiment of the invention.

A film formation device according to a fourth embodiment of the invention is described with reference to the drawings. FIG. 6 is a sectional view illustrating the entire structure of the device. The components which are the same as those in the first embodiment are denoted by the same reference numerals and explanation thereof is omitted.

In the film formation device 4 of this embodiment, similarly to the device of the first embodiment, the substrate holder 11 is electrically connected to the DC current applying unit (potential controlling means) 17 provided externally to the vacuum vessel 10, so that a potential can be applied to the substrate holder 11, and the potential is controllable. Also, the size of the holder body 11A of the substrate holder 11 is designed to be larger than the substrate B by 10 mm or more from the outer circumference of the substrate B in a direction lateral to the substrate B. That is, the distance D1 between the outer circumference of the substrate B and the outer circumference of the substrate holder 11 is 10 mm or more. In this embodiment, this design allows to control the potential in the spatial range of at least 10 mm extending laterally from the outer circumference of the substrate B to be equal to the potential on the substrate B. Also in this embodiment, $D1 \geq 10$ mm, optionally $D1 \geq 30$ mm, and further optionally $D1 \geq 50$ mm.

In this embodiment, a wall member 45 is provided to stand from the inner bottom surface of the vacuum vessel 10 so as to surround the substrate holder 11. The wall member 45 is made of a conductive material, such as stainless steel, and is insulated from the vacuum vessel 10 via an insulating material (the insulating material is not shown).

The wall member 45 is electrically connected to a DC current applying unit (potential controlling means) 47, which is provided externally to the vacuum vessel 10, so that a potential can be applied to the wall member 45, and the potential is controllable. The DC current applying unit 47 generally includes a DC power supply 47A and a matching circuit 47B. The matching circuit 47B is provided optionally. The matching circuit 47B disposed between the DC power supply 47A and the wall member 45 facilitates control of the potential on the wall member 45. In this embodiment, a potential is applied to the wall member 45 to control the potential at least on a surface 45S of the wall member 45, which faces the substrate holder 11, to be equal to the potential on the substrate B. That is, in this embodiment, the film formation is carried out with surrounding the substrate B with the surface 45S facing the substrate holder 11, which has the potential controlled to be equal to the potential on the substrate B, of the wall member 45.

A distance D3 between the outer circumference of the substrate B and the surface 45S of the wall member 45 facing the substrate holder 11 is not particularly limited. In view of effectively providing the potential control effect with the wall member 45, the distance D3 may be 20-150 mm.

The height of the wall member 45 is not particularly limited. If the height of the wall member 45 is significantly lower than the substrate surface, the potential control effect with the wall member 45 cannot effectively be provided. In contrast, if the height of the wall member 45 is significantly higher than the substrate surface, the presence of the wall member 45 may hinder deposition of the sputtered particles on the substrate, and may impair homogeneity of the formed film, such as film thickness. The height of the wall member 45 may be in the range of ±20 mm of the height of the substrate surface.

In this embodiment, the substrate holder 11 and the wall member 45 are connected to the different DC current applying units. However, the substrate B and the wall member 45 may be connected to the same DC current applying unit, as long as the potential on the substrate holder 11 and the potential on the wall member 45 can be controlled to be equal.

By using the film formation device 4 of this embodiment, the first and second aspects of the film formation method of the invention can be implemented. That is, the film formation can be carried out with controlling the potential in the spatial range of at least 10 mm extending laterally from the outer circumference of the substrate B to be equal to the potential on the substrate B. Further, the film formation can be carried out with surrounding the substrate B with a wall surface (in this embodiment, the surface 45S of the wall member 45 facing the substrate holder 11) having the potential which is controlled to be equal to the potential on the substrate. According to this embodiment, the potential can be homogenized across the in-plane direction of the substrate, and the energy of the plasma ions plunging into the substrate can be homogenized across the in-plane direction of the substrate, thereby achieving high-level homogenization of film properties, such as composition, in the in-plane direction.

In this embodiment, in place of the DC current applying unit 47, the impedance controller 20 shown in the second embodiment may be connected to the wall member 45. In this case, by connecting the impedance controller 20 to the wall member 45 with the wall member 45 being floated, the potential on the wall member 45 can be controlled to be equal to the potential on the substrate B.

The film formation device described in this embodiment can simultaneously implement the first and second aspects of the film formation method of the invention. However, if the potential in the space lateral to the substrate is not controlled to be equal to the potential on the substrate, only the second aspect of the film formation method of the invention can be implemented.

Piezoelectric Device and Inkjet Recording Head

Figure 7:
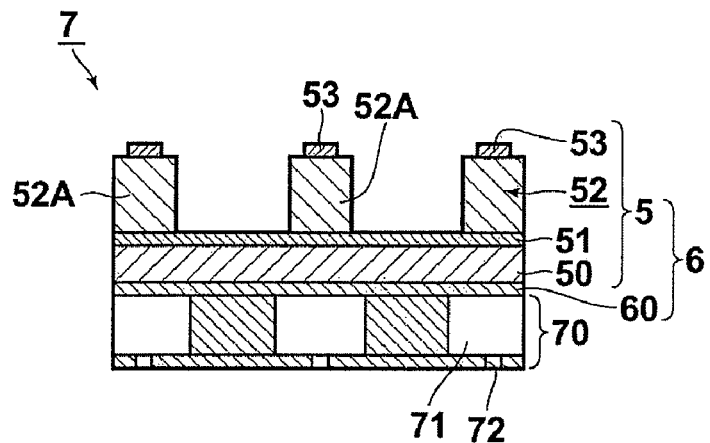
FIG. 7 is a sectional view illustrating the structures of a piezoelectric device and an inkjet recording head according to one embodiment of the invention.

The structures of a piezoelectric device and an inkjet recording head (liquid discharge device) including the piezoelectric device according to one embodiment of the invention are described with reference to FIG. 7. FIG. 7 is a sectional view illustrating the main portion of the inkjet recording head (a sectional view taken along the thickness direction of the piezoelectric device). For ease of visual understanding, the components shown in the drawing are not to scale.

A piezoelectric device 5 of this embodiment includes a substrate 50, and a lower electrode 51, a piezoelectric film 52 and an upper electrode 53 which are sequentially formed on the substrate 50. An electric field in the thickness direction is applied to the piezoelectric film 52 via the lower electrode 51 and the upper electrode 53.

The lower electrode 51 is formed over substantially the entire surface of the substrate 50. The piezoelectric film 52, which is formed by line-shaped protrusions 52A arranged in stripes pattern extending in a direction perpendicular to the plane of the drawing, is formed on the lower electrode 51, and the upper electrodes 53 are formed on the individual protrusions 52A.

The pattern of the piezoelectric film 52 is not limited to one shown in the drawing, and may be designed as appropriate. Alternatively, the piezoelectric film 52 may be a continuous film. However, when the piezoelectric film 52 is not a continuous film and has the pattern including the plurality of separate protrusions 52A, the individual protrusions 52A can smoothly expand or contract, thereby preferably providing larger displacement.

The substrate 50 is not particularly limited, and may be any of various substrates, such as silicon, silicon oxide, stainless steel (SUS), yttrium stabilized zirconia (YSZ), alumina, sapphire, SiC, and $SrTiO_3$. The substrate 50 may be a multilayer substrate, such as a SOI substrate including a $SiO_2$ film and a Si active layer formed on a silicon substrate.

The composition of the lower electrode 51 is not particularly limited, and examples thereof may include a metal or a metal oxide, such as Au, Pt, Ir, $IrO_2$, $RuO_2$, $LaNiO_3$, and $SrRuO_3$, as well as combinations thereof. The composition of the upper electrode 53 is not particularly limited, and examples thereof may include the example materials described for the lower electrode 51, electrode materials commonly used in semiconductor processes, such as Al, Ta, Cr and Cu, and combinations thereof. The thicknesses of the lower electrode 51 and the upper electrode 53 are not particularly limited; however, their thicknesses may be in the range from 50 to 500 nm.

The piezoelectric film 52 is formed with the film formation method according to the first or second embodiment of the invention. The piezoelectric film 52 may contain, as a main component, one or two or more perovskite oxides represented by general formula (P) described above. Optionally, the piezoelectric film 52 may contain one or two or more perovskite oxides represented by general formula (P) and may have the A-site element which is at least one metal element selected from the group consisting of Pb, Bi and Ba, The film thickness of the piezoelectric film 52 is not particularly limited; however, it is usually 1 μm or more (for example, 1-5 μm).

A piezoelectric actuator 6 includes a vibrating plate 60, which vibrates along with expansion and contraction of the piezoelectric film 52, attached on the back side of the substrate 50 of the piezoelectric device 5, The piezoelectric actuator 6 also includes a controlling means (not shown), such as a driving circuit, for controlling drive of the piezoelectric device 5.

The inkjet recording head (liquid discharge device) 7 generally includes, at the back side of the piezoelectric actuator 6, an ink nozzle (liquid storing and discharging member) 70 including an ink chamber (liquid reservoir) 71 for storing ink and an ink discharge port (liquid discharge port) 72 through which the ink is discharged from the ink chamber 71 to the outside. In the inkjet recording head 7, the piezoelectric device 5 expands or contracts when the intensity of the electric field applied to the piezoelectric device 5 is increased or decreased, thereby controlling discharge of the ink from the ink chamber 71 and the amount of the discharged ink.

Instead of providing the vibrating plate 60 and the ink nozzle 70, which are members separate from the substrate 50, parts of the substrate 50 may be machined to form the vibrating plate 60 and the ink nozzle 70. For example, if the substrate 50 is a multilayer substrate, such as a SOI substrate, the substrate 50 maybe etched at the back side thereof to form the ink chamber 61, and then the substrate may be machined to form the vibrating plate 60 and the ink nozzle 70.

The structures of the piezoelectric device 5 and the inkjet recording head 7 of this embodiment are as described above. According to this embodiment, the piezoelectric film 52 which is formed according to the above-described film formation method and has highly homogenized film properties, such as composition, in the in-plane direction, as well as the piezoelectric device 5 including the piezoelectric film 52 can be provided.

Inkjet Recording Device

Figure 8:
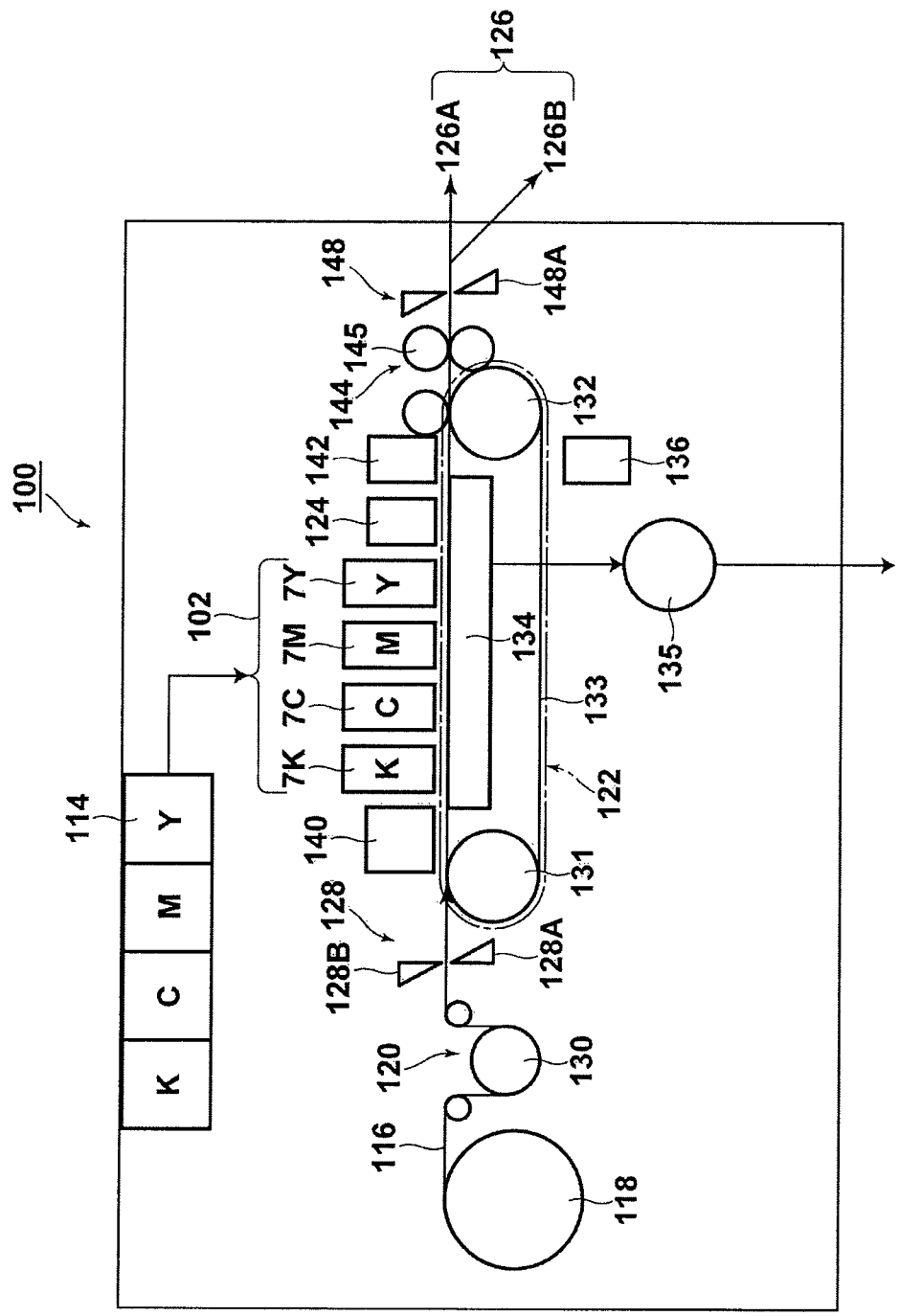
FIG. 8 is a diagram illustrating a configuration example of an inkjet recording device.
Figure 9:
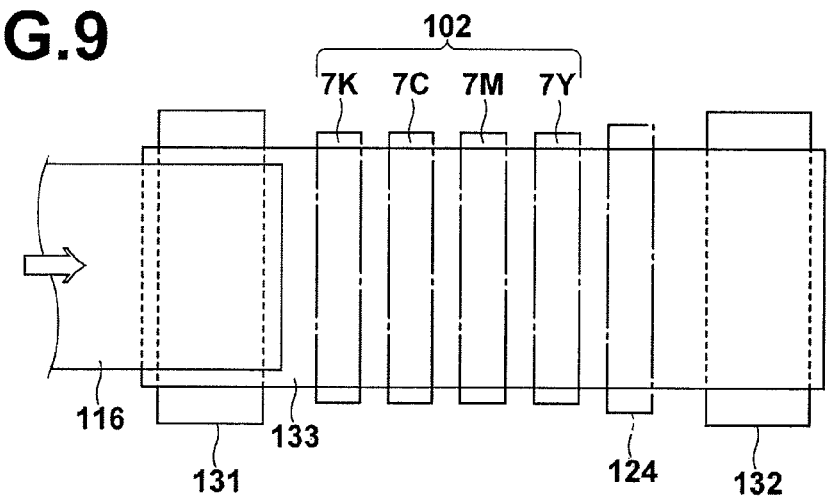
FIG. 9 is a partial plan view of the inkjet recording device shown in FIG. 8.

Now, an example configuration of an inkjet recording device including the inkjet recording head 7 of the above-described embodiment is described with reference to FIGS. 8 and 9. FIG. 8 shows the entire device configuration, and FIG. 9 is a partial plan view of the device.

An inkjet recording device 100 shown in the drawing generally includes: a printing section 102 having a plurality of inkjet recording heads (hereinafter simply referred to as "heads") 7K, 7C, 7M and 7Y provided correspondingly to ink colors; an ink storing and charging section 114 for storing inks to be fed to the heads 7K, 7C, 7M and 7Y; a paper feeding section 118 for feeding recording paper 116; a decurling section 120 for decurling the recording paper 116; a suction belt conveyer section 122 disposed to face to the nozzle surface (ink discharge surface) of the printing section 102, for conveying the recording paper 116 with keeping the flatness of the recording paper 116; a print detection section 124 for reading the result of printing at the printing section 102; and a paper discharge section 126 for discharging the printed recording paper (a print) to the outside.

Each of the heads 7K, 7C, 7M and 7Y forming the printing section 102 corresponds to the inkjet recording head 7 of the above-described embodiment.

At the decurling section 120, the recording paper 116 is decurled with a heating drum 130 heating the recording paper 116 in a direction opposite to the direction of the curl.

In the device using the roll paper, a cutter 128 is provided downstream the decurling section 120, as shown in FIG. 8, so that the roll paper is cut by the cutter into a sheet of a desired size. The cutter 128 is formed by a fixed blade 128A, which has a length equal to or larger than the width of the conveyance path for the recording paper 116, and a round blade 128B, which moves along the fixed blade 128A. The fixed blade 128A is disposed on the back surface side of the print, and the round blade 128B is disposed on the print surface side via the conveyance path. In a case where the device uses cut sheets, the cutter 128 is not necessary.

The decurled and cut recording paper sheet 116 is sent to the suction belt conveyer section 122. The suction belt conveyer section 122 includes an endless belt 133 wrapped around rollers 131 and 132, and is adapted such that at least an area of the belt facing the nozzle surface of the printing section 102 and a sensor surface of the print detection section 124 forms a horizontal (flat) surface.

The belt 133 has a width that is larger than the width of the recording paper sheet 116, and a number of suction holes (not shown) are formed in the belt surface. A suction chamber 134 is provided on the inner side of the belt 133 wrapped around the rollers 131 and 132 at a position where the suction chamber 134 faces to the nozzle surface of the printing section 102 and the sensor surface of the print detection section 124. A suction force generated by a fan 135 provides the suction chamber 134 with a negative pressure, thereby holding the recording paper sheet 116 on the belt 133 with suction.

As a motive force from a motor (not shown) is transmitted to at least one of the rollers 131 and 132, around which the belt 133 is wrapped, the belt 133 is driven in the clockwise direction in FIG. 8, and the recording paper 116 held on the belt 133 is conveyed from the left to the right in FIG. 8.

In a case where margin-less printing, or the like, is carried out, the inks adhere on the belt 133. Therefore, a belt cleaning section 136 is provided at a predetermined position (any appropriate position other than the print region) on the outer side of the belt 133.

A heating fan 140 is provided upstream the printing section 102 along the paper sheet conveyance path formed by the suction belt conveyer section 122. The heating fan 140 blows heating air onto the recording paper sheet 116 to heat the recording paper sheet 116 before printing. Heating the recording paper sheet 116 immediately before printing promotes drying of the deposited ink.

The printing section 102 is a so-called full-line head, in which line heads, each having a length corresponding to the maximum paper width, are arranged in a direction (main scanning direction) perpendicular to the paper feed direction (see FIG. 9). Each recording head 7K, 7C, 7M, 7Y is formed by a line head, which has a plurality of ink discharge orifices (nozzles) provided across a length that is larger than at least one side of the recording paper sheet 116 of the maximum size intended to be printed by the inkjet recording device 100.

The heads 7K, 7C, 7M and 7Y respectively corresponding to the color inks of black (K), cyan (C), magenta (M) and yellow (Y) are disposed in this order from the upstream along the feed direction of the recording paper sheet 116. By discharging the color inks from the heads 7K, 7C, 7M and 7Y while the recording paper sheet 116 is conveyed, a color image is recorded on the recording paper sheet 116.

The print detection section 124 is formed by a line sensor, or the like, which images the result of ink droplets deposited by the printing section 102, and the image of the deposited ink droplets read by the line sensor is used to detect discharge defects, such as clogging of the nozzles.

A drying section 142 formed, for example, by a heating fan for drying the printed image surface is disposed downstream the print detection section 124. Since contact with the printed surface should be avoided until the printed inks dry, blowing hot air may be preferred.

A heating and pressurizing section 144 for controlling the gloss of the image surface is disposed downstream the drying section 142. The heating and pressurizing section 144 presses the image surface with a pressure roller 145 having a predetermined textured pattern on the surface thereof while heating the image surface, thereby transferring the textured pattern onto the image surface.

The thus obtained print is discharged at the paper discharge section 126. Prints of intended images (prints on which intended images are printed) and test prints may separately be discharged. The inkjet recording device 100 includes a sorting means (not shown) for sorting the prints of intended images and the test prints and switching the discharge paths to selectively send them to a discharge section 126A or 126B.

In a case where an intended image and a test print are printed at the same time on a large-sized paper sheet, a cutter 148 may be provided to cut off the test print area.

The configuration of the inkjet recording device 100 is as described above.

Piezoelectric Ultrasonic Transducer (Ultrasonic Transducer)

Figure 10:
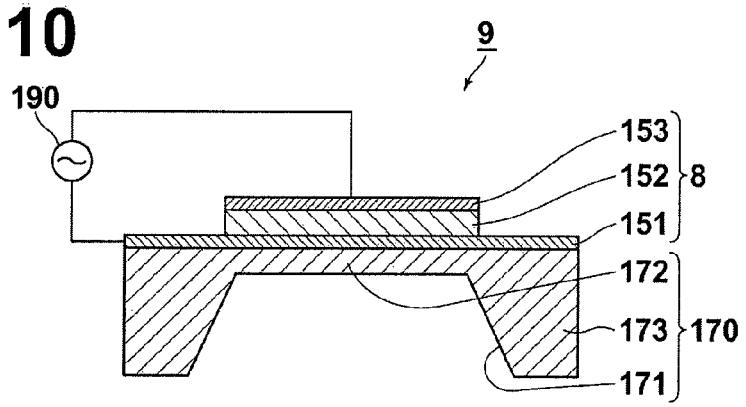
FIG. 10 is a sectional view illustrating the structure of a piezoelectric ultrasonic transducer according to one embodiment of the invention.

The structure of a piezoelectric ultrasonic transducer according to one embodiment of the invention is described with reference to FIG. 10. FIG. 10 is a sectional view illustrating the main portion of the piezoelectric ultrasonic transducer. For ease of visual understanding, the components shown in the drawing are not to scale.

A piezoelectric ultrasonic transducer 9 of this embodiment generally includes: a SOI substrate 170 having an "open pool" structure, which is formed through reactive ion etching (RIE) on the back side of the substrate to integrally include a cavity 171, a vibrating plate 172, and a supporting section 173 for supporting the vibrating plate 172; a piezoelectric device 8 formed on the substrate; and a RF power supply (radio frequency AC power supply) 190 for applying an AC current to electrodes 151 and 153 of the piezoelectric device 8. The piezoelectric device 8 has a multilayer structure including the lower electrode 151, a piezoelectric film 152 and an upper electrode 153, which are disposed in this order on the substrate 170.

The compositions and thicknesses of the lower electrode 151 and the upper electrode 153 are similar to those of the lower electrode 51 and the upper electrode 53 of the piezoelectric device 5 shown in FIG. 7. The piezoelectric film 152 is formed according to the first or second aspect of the film formation method of the invention. The composition and thickness of the piezoelectric film 152 are similar to those of the piezoelectric film 52 of the piezoelectric device 5 shown in FIG. 7.

When an electric AC signal in the ultrasonic range is applied to the electrodes 151 and 153 of the piezoelectric device 8, the piezoelectric device 8 makes flexure vibration at the same frequency as that of the applied electric AC signal, and the vibrating plate 172 makes flexure vibration together with the piezoelectric device 8. At this time, the vibrating plate 172 vibrates with the peripheral edge thereof being supported by the supporting section 173, causing emission of an ultrasonic wave, which has the same frequency as that of the applied electric AC signal, from the side of the vibrating plate 172 opposite from the piezoelectric device 8.

The structure of the piezoelectric ultrasonic transducer 9 of this embodiment is as described above.

The piezoelectric ultrasonic transducer 9 of this embodiment is applicable to ultrasonic motors, for example.

Further, the piezoelectric ultrasonic transducer 9 of this embodiment can be used as a sensor which emits an ultrasonic wave with a particular frequency and senses the ultrasonic wave reflected and returned from an object, and is applicable to an ultrasonic probe, etc. When the ultrasonic wave reflected and returned from the object is received and the vibrating plate 172 vibrates, the stress of the vibration causes the piezoelectric film 152 to displace, and a voltage corresponding to the amount of the displacement is generated in the piezoelectric device 8. By detecting this voltage, the shape, etc., of the object can be detected.

Modification

The invention is not limited to the above-described embodiments, and may be modified as appropriate without departing from the spirit and scope of the invention.

EXAMPLES

Now, examples according to the invention and a comparative example are described.

Example 1

A 10-nanometer thick Ti film and a 150-nanometer thick Ir lower electrode were sequentially formed on a 200-mm diameter silicon wafer through sputtering. Then, a 4-micrometer thick Nb-PZT piezoelectric film was formed on the resulting substrate through RF sputtering.

In this example, the film formation device 2 of the second embodiment shown in FIGS. 2 and 3 was used. In the film formation device used, the size of the substrate holder was larger than the outer circumference of the substrate by 30 mm (D1=30 mm), and the impedance controller was connected to the substrate holder. The vacuum vessel was grounded. The distance D2 between the outer circumference of the substrate and the inner wall surface of the vacuum vessel was 60 mm (D2=60 mm). While the substrate potential during film formation was monitored, the impedance at the substrate holder was controlled with the impedance controller to control the substrate potential to be +70 V.

Other film formation conditions were as follows:
target: $Pb_{1.3}(Zr_{0.52}Ti_{0.48})_{0.88}Nb_{0.12}O_3$ sintered body (300 mm diameter),
substrate temperature: 525° C.,
film formation gas: $Ar/O_2$=100/1 (molar ratio),
film formation pressure: 0.5 Pa,
target-substrate distance: 80 mm, and
RF power: 3 kW.

A potential distribution under the film formation conditions was simulated. The result is shown in FIG. 11. In FIG. 11, the figure on the right shows a positional relationship between the substrate and the target, and the graph on the left shows the potential distribution corresponding to this positional relationship.

In FIG. 11, the transverse axis represents positions in the transverse direction (the in-plane direction of the substrate), with the center of the substrate being the origin (0 mm). In this example, the substrate extended to the position of 100 mm, and the target extended to the position of 150 mm. The vertical axis represents positions in the direction perpendicular to the substrate surface, where the position of the target surface is 80 mm, and the position of the substrate surface is 160 mm.

Since this image of the potential distribution, which originally is a color image, is shown in black and white, it is difficult to show the color gradation thereof; however, it is generally shown in six levels (VI, V, IV, III, II, I), from the higher to lower potentials, corresponding to red, orange, yellow, green, light blue and blue in the original image. As can be seen from the graph, in this example, the potential within the spatial range of about 30 mm extending laterally from the outer circumference of the substrate was controlled to be equal to the potential on the substrate.

An energy distribution of the argon ions plunging into the substrate was simulated. The result is shown in FIG. 12. Similarly to FIG. 11, the transverse axis represents positions in the transverse direction (the in-plane direction of the substrate), with the center of the substrate being the origin (0 mm). In this example, the substrate extended to the position of 100 mm, and the inner wall surface of the vacuum vessel was positioned at 160 mm. As can be seen from the graph, the energy distribution of the argon ions plunging into the substrate was homogeneous across the entire range in the in-plane direction of the substrate. Further, the energy distribution of the argon ions plunging into the substrate was homogeneous in a spatial range of about 20 mm extending laterally from the outer circumference of the substrate.

XRD analysis was carried out on the resulting Nb-PZT film, and the film was found to be a (100)-oriented film having a perovskite structure. The film was divided into a number of regions in the in-plane direction and XRD analysis was carried out for each region, and it was found that a good quality film with good crystalline orientation was formed across the in-plane direction.

The resulting Nb-PZT film was divided into nine regions in the in-plane direction, except a marginal region of 5 mm from the edge, and XRF composition analysis was carried out for each region. The variation of the molar ratio of Pb/(Zr+Ti+Nb) was found to be 1.05±0.02 (variation 1.9%), which was nearly homogeneous.

Finally, a Ti/Pt upper electrode (Ti: 20 nm thick/Pt: 150 nm thick) was vapor deposited on the Nb-PZT film to provide the piezoelectric device of the invention.

The resulting piezoelectric device was divided into nine regions in the in-plane direction, except a marginal region of 5 mm from the edge, and the piezoelectric constant d31 was measured for each region. The piezoelectric constant d31=245 pm/V±4%, which was highly homogeneous, and thus good result was obtained.

Even when the film composition was changed to provide an intrinsic PZT film, a PZT film with homogeneous composition distribution was successfully formed. Even when the DC current applying unit shown in FIG. 1 was connected to the substrate holder in place of the impedance controller, the film formation was successfully carried out, and a Nb-PZT film having the similar performance was formed.

Example 2

The piezoelectric device of the invention was provided in the same manner as in example 1, except that D1=12 mm in the film formation device used to form the piezoelectric film. The resulting Nb-PZT film was divided into nine regions in the in-plane direction, except a marginal region of 5 mm from the edge, and XRF composition analysis was carried out for each region. The variation of the molar ratio of Pb/(Zr+Ti+Nb) was found to be 1.05±0.03 (variation 2.8%), which was nearly homogeneous.

Example 3

The piezoelectric device of the invention was provided in the same manner as in example 1, except that the film formation conditions for forming the piezoelectric film were changed.

Similarly to example 1, in the film formation device used, the substrate holder was connected to the impedance controller, as with the film formation device 2 of the second embodiment shown in FIGS. 2 and 3. In this example, the size of the substrate holder was larger than the outer circumference of the substrate by 50 mm. In the film formation device used, the vacuum vessel was grounded, and the wall member connected to the impedance controller was disposed to surround the substrate holder, as with the film formation device 4 of the fourth embodiment shown in FIG. 6. The distance D3 between the outer circumference of the substrate and the surface of the wall member facing the substrate holder was 50 mm (D3=50 mm), and the height of the wall member was higher than the substrate surface by 10 mm.

While the substrate potential during film formation was monitored, the impedance at the substrate holder and the wall member was controlled with the impedance controller to control the substrate potential and the potential on the surface of the wall member facing substrate holder to be +70 V. Other film formation conditions were the same as those in example 1.

XRD analysis was carried out on the resulting Nb-PZT film, and the film was found to be a (100)-oriented film having a perovskite structure. The film was divided into a number of regions in the in-plane direction and XRD analysis was carried out for each region, and it was found that a good quality film with good crystalline orientation was formed across the in-plane direction.

The resulting Nb-PZT film was divided into nine regions in the in-plane direction, except a marginal region of 5 mm from the edge, and XRF composition analysis was carried out for each region. The variation of the molar ratio of Pb/(Zr+Ti+Nb) was found to be 1.05±0.02 (variation 1.9%), which was nearly homogeneous.

The resulting piezoelectric device was divided into nine regions in the in-plane direction, except a marginal region of 5 mm from the edge, and the piezoelectric constant d31 was measured for each region. The piezoelectric constant d31=246 pm/V±3%, which was highly homogeneous, and thus good result was obtained.

Even when the film composition was changed to provide an intrinsic PZT film, a PZT film with homogeneous composition distribution was successfully formed. Even when the DC current applying unit shown in FIG. 1 was connected to the substrate holder in place of the impedance controller, the film formation was successfully carried out, and a Nb-PZT film having the similar performance was formed.

Comparative Example 1

A piezoelectric device was provided in the same manner as in example 1, except that the substrate holder used during film formation of the piezoelectric film was changed to one which was larger than the outer circumference of the substrate by 7 mm.

XRD analysis was carried out on the resulting Nb-PZT film, and the film was found to be a (100)-oriented film having a perovskite structure. The film was divided into a number of regions in the in-plane direction and XRD analysis was carried out for each region, and it was found that a good quality film with good crystalline orientation was formed across the in-plane direction.

A potential distribution under the film formation conditions was simulated. The result is shown in FIG. 13. FIG. 13 corresponds to FIG. 11 of example 1. Similarly to FIG. 11, the transverse axis represents positions in the transverse direction (the in-plane direction of the substrate), with the center of the substrate being the origin (0 mm). In this example, the substrate extended to the position of 100 mm, and the target extended to the position of 150 mm. The vertical axis represents positions in the direction perpendicular to the substrate surface, where the position of the target surface is 80 mm, and the position of the substrate surface is 160 mm.

Similarly to FIG. 11, since the image of the potential distribution, which originally is a color image, is shown in black and white, it is difficult to show the color gradation thereof; however, it is generally shown in six levels (VI, V, IV, III, II, I), from the higher to lower potentials, corresponding to red, orange, yellow, green, light blue and blue in the original image. As can be seen from FIG. 13, in this comparative example, the potential at the outer circumference of the substrate is lower than the potential at the center of the substrate. Further, the potential in an area in the vicinity of the substrate within the spatial range of about 30 mm extending laterally from the outer circumference of the substrate was significantly lower than the potential at the center of the substrate.

An energy distribution of the argon ions plunging into the substrate was simulated. The result is shown in FIG. 14. Similarly to FIG. 12, the transverse axis represents positions in the transverse direction (the in-plane direction of the substrate), with the center of the substrate being the origin (0 mm). In this example, the substrate extended to the position of 100 mm, and the inner wall surface of the vacuum vessel was positioned at 160 mm. As can be seen from the graph, a large variation was observed in the energy of the argon ions plunging into the substrate within the positional range of 0-100 mm along the transverse axis where the substrate was present. In particular, at the outer circumference of the substrate, the energy of the argon ions plunging into the substrate greatly increased.

The resulting Nb-PZT film was divided into nine regions in the in-plane direction, except a marginal region of 5 mm from the edge, and XRF composition analysis was carried out for each region. The variation of the molar ratio of Pb/(Zr+Ti+Nb) was found to be 1.05±0.05 (variation 4.76%), which was large, and the amount of Pb at the outer circumference tended to be lower than that at the center. The reason of this is believed that, since the energy of the argon ions plunging into the substrate greatly increased at the outer circumference of the substrate, as shown in FIG. 14, the rate of reverse sputtering of Pb was increased at the outer circumference of the substrate, resulting in the low amount of Pb.

The resulting piezoelectric device was divided into nine regions in the in-plane direction, except a marginal region of 5 mm from the edge, and the piezoelectric constant d31 was measured for each region. piezoelectric constant d31=245 pm/V±7%, which was poor in homogeneity.

INDUSTRIAL APPLICABILITY

The present invention is applicable to formation of a film having any composition through vapor deposition using plasma. The invention is applicable, for example, to formation of a piezoelectric film that is used in piezoelectric devices, piezoelectric ultrasonic transducers or piezoelectric power generation devices provided in inkjet recording heads, magnetic read/write heads, MEMS (Micro Electro-Mechanical Systems) devices, micropumps, ultrasound probes, ultrasound motors, etc., and ferroelectric devices, such as ferroelectric memory, or formation of conductor films or semiconductor films containing a Zn-containing compound.

The invention claimed is:

1. A film formation device for fanning, on a substrate, a film containing constituent elements of a target through a vapor deposition process using plasma, the device comprising: a vacuum vessel comprising therein a substrate holder and a target holder disposed to face to each other; plasma generating means for generating plasma within the vacuum vessel; and gas introducing means for introducing a gas to be plasmized into the vacuum vessel, wherein the substrate holder is larger than an outer circumference of the substrate by 10 mm or more in a direction lateral to the substrate, the substrate holder is connected to a potential controlling means for controlling a potential on the substrate holder, and a potential in a spatial range of at least 10 mm extending laterally from the outer circumference of the substrate is controllable to be equal to a potential on the substrate.

2. The film formation device as claimed in claim 1, wherein the potential controlling means comprises a power supply for applying a potential to the substrate holder, or an impedance circuit for controlling an impedance at the substrate holder.

3. The film formation device as claimed in claim 2, wherein the potential controlling means comprises the impedance circuit, and an end of the impedance circuit opposite from an end thereof connected to the substrate holder is grounded or floated.

4. The film formation device as claimed in claim 2, wherein the potential controlling means comprises the impedance circuit, and the potential controlling means further comprises an AC power supply, the AC power supply being connected to an end of the impedance circuit opposite from an end thereof connected to the substrate holder.

5. The film formation device as claimed in claim 4, wherein an end of the AC power supply opposite from an end thereof connected to the impedance circuit is grounded.

6. The film formation device as claimed in claim 4, wherein the AC power supply is adapted such that power on or power off of the AC power supply, and the potential applied from the AC power supply to the impedance circuit are switchable.

7. The film formation device as claimed in claim 1, wherein the substrate holder comprises a plate-like holder body for receiving the substrate placed thereon and a securing member for securing an edge of the substrate, and the substrate holder and the securing member are provided with an equal potential.

8. A film formation device for forming, on a substrate, a film containing constituent elements of a target through a vapor deposition process using plasma, the device comprising:
a vacuum vessel comprising therein a substrate holder and a target holder disposed to face to each other;
plasma generating means for generating plasma within the vacuum vessel; and
gas introducing means for introducing a gas to be plasmized into the vacuum vessel,
wherein the substrate holder is surrounded with a wall surface having a potential controllable to be equal to a potential on the substrate, wherein the vacuum vessel is connected to potential controlling means for controlling a potential on the vacuum vessel, and a potential at least on a surface of the vacuum vessel facing the substrate holder is controllable to be equal to the potential on the substrate.

9. The film fog illation device as claimed in claim 8, wherein the potential controlling means comprises a power supply for applying a potential to the vacuum vessel, or an impedance circuit for controlling an impedance at the vacuum vessel.

10. The film formation device as claimed in claim claim 8, wherein the substrate holder is surrounded with a wall member, a potential on at least a surface of the wall member facing the substrate holder being controllable to be equal to the potential on the substrate.

\* \* \* \* \*